US012476082B2

(12) United States Patent
Marakhtanov et al.

(10) Patent No.: US 12,476,082 B2
(45) Date of Patent: Nov. 18, 2025

(54) RADIOFREQUENCY SIGNAL FILTER ARRANGEMENT FOR PLASMA PROCESSING SYSTEM

(71) Applicant: Lam Research Corporation, Fremont, CA (US)

(72) Inventors: Alexei Marakhtanov, Albany, CA (US); Felix Kozakevich, Sunnyvale, CA (US); Bing Ji, Pleasanton, CA (US); Ranadeep Bhowmick, San Jose, CA (US); John Holland, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 229 days.

(21) Appl. No.: 17/793,372

(22) PCT Filed: Jan. 30, 2021

(86) PCT No.: PCT/US2021/015956

§ 371 (c)(1),
(2) Date: Jul. 15, 2022

(87) PCT Pub. No.: WO2021/158451

PCT Pub. Date: Aug. 12, 2021

(65) Prior Publication Data

US 2023/0054699 A1 Feb. 23, 2023

Related U.S. Application Data

(60) Provisional application No. 62/970,168, filed on Feb. 4, 2020.

(51) Int. Cl.
*H01J 37/32* (2006.01)

(52) U.S. Cl.
CPC .. *H01J 37/32183* (2013.01); *H01J 37/32541* (2013.01); *H01J 37/32577* (2013.01);
(Continued)

(58) Field of Classification Search
None
See application file for complete search history.

(56) References Cited

U.S. PATENT DOCUMENTS 7,611,603 B2 * 11/2009 Yamazawa ........ H01J 37/32091 315/111.41
8,884,520 B2 11/2014 Kim et al.
(Continued)

FOREIGN PATENT DOCUMENTS

CN 102742366 A 10/2012
JP 2007266533 A 10/2007
(Continued)

OTHER PUBLICATIONS

International Search Report and Written Opinion of the International Searching Authority, PCT/US2021/015956.

*Primary Examiner* — Srinivas Sathiraju
(74) *Attorney, Agent, or Firm* — Penilla IP, APC

(57) ABSTRACT

A tunable edge sheath (TES) system includes a coupling ring configured to couple to a bottom surface of an edge ring that surrounds a wafer support area within a plasma processing chamber. The TES system includes an annular-shaped electrode embedded within the coupling ring. The TES system includes a plurality of radiofrequency signal supply pins coupled to the electrode within the coupling ring. Each of the plurality of radiofrequency signal supply pins extends through a corresponding hole formed through a bottom surface of the coupling ring. The TES system includes a plurality of radiofrequency signal filters respectively connected to the plurality of radiofrequency supply pins. Each of the plurality of radiofrequency signal filters is configured
(Continued)

to provide a high impedance to radiofrequency signals used to generate a plasma within the plasma processing chamber.

20 Claims, 23 Drawing Sheets

(52) U.S. Cl.
CPC .. *H01J 37/32642* (2013.01); *H01J 37/32724* (2013.01); *H01J 2237/3341* (2013.01)

(56) References Cited

U.S. PATENT DOCUMENTS

| | | | | |
|---|---|---|---|---|
| 9,852,889 | B1 * | 12/2017 | Kellogg | H01J 37/32091 |
| 10,115,568 | B2 * | 10/2018 | Kellogg | H01J 37/1471 |
| 10,141,165 | B2 | 11/2018 | Kusumoto et al. | |
| 10,615,003 | B2 * | 4/2020 | Kellogg | H01J 37/32366 |
| 10,796,885 | B2 | 10/2020 | Johnson et al. | |
| 10,825,656 | B2 * | 11/2020 | Kellogg | H01J 37/32091 |
| 10,991,549 | B2 | 4/2021 | Ikeda et al. | |
| 2004/0027781 | A1 | 2/2004 | Hanawa et al. | |
| 2004/0121610 | A1 * | 6/2004 | Russell | H01J 37/32091 438/710 |
| 2005/0178748 | A1 * | 8/2005 | Buchberger, Jr. | H01J 37/32183 219/121.48 |
| 2005/0221020 | A1 * | 10/2005 | Fukiage | C23C 16/4405 257/E21.261 |
| 2006/0096538 | A1 * | 5/2006 | Russell | C23C 16/509 156/345.48 |
| 2007/0227449 | A1 * | 10/2007 | Yamazawa | H01J 37/32091 118/723 I |
| 2009/0188627 | A1 * | 7/2009 | Fang | H01J 37/32449 156/345.43 |
| 2010/0012029 | A1 | 1/2010 | Forster et al. | |
| 2011/0005679 | A1 | 1/2011 | Hanawa et al. | |
| 2011/0126765 | A1 | 6/2011 | Yamazawa et al. | |
| 2013/0133834 | A1 | 5/2013 | Dhindsa | |
| 2014/0083361 | A1 * | 3/2014 | Rocha-Alvarez | H01L 21/6719 118/723 E |
| 2014/0083977 | A1 | 3/2014 | Ui et al. | |
| 2015/0001180 | A1 * | 1/2015 | Doan | H01J 37/32623 156/345.1 |
| 2015/0099365 | A1 * | 4/2015 | Chen | H01J 37/32091 156/345.24 |
| 2016/0056022 | A1 * | 2/2016 | Hudson | H01J 37/32623 216/71 |
| 2016/0322242 | A1 * | 11/2016 | Nguyen | H01J 37/321 |
| 2018/0068834 | A1 * | 3/2018 | Valcore, Jr. | H01J 37/32926 |
| 2018/0082822 | A1 * | 3/2018 | Kellogg | H01J 37/32155 |
| 2018/0151396 | A1 * | 5/2018 | Hanzlik | H01L 21/67051 |
| 2018/0218933 | A1 * | 8/2018 | Luere | H01J 37/32431 |
| 2018/0226233 | A1 * | 8/2018 | Long | H01J 37/321 |
| 2018/0233334 | A1 * | 8/2018 | Luere | H01J 37/32642 |
| 2018/0323044 | A1 | 11/2018 | Brown et al. | |
| 2018/0342374 | A1 * | 11/2018 | Liang | H01J 37/3244 |
| 2018/0366306 | A1 * | 12/2018 | Yang | H01J 37/32715 |
| 2019/0013184 | A1 * | 1/2019 | Cui | H01J 37/32183 |
| 2019/0043695 | A1 | 2/2019 | Wu et al. | |
| 2019/0057839 | A1 * | 2/2019 | Kellogg | H01J 37/32091 |
| 2019/0177848 | A1 * | 6/2019 | Chen | H01J 37/32715 |
| 2019/0206703 | A1 * | 7/2019 | Zhao | H01J 37/32174 |
| 2019/0312607 | A1 * | 10/2019 | Korn | H04B 7/04 |
| 2019/0341275 | A1 * | 11/2019 | Jin | B08B 7/0035 |
| 2019/0362948 | A1 * | 11/2019 | Sarode Vishwanath | H01J 37/32724 |
| 2019/0362949 | A1 * | 11/2019 | Sarode Vishwanath | H01J 37/321 |
| 2019/0363003 | A1 * | 11/2019 | Sarode Vishwanath | H01L 21/68735 |
| 2020/0118798 | A1 * | 4/2020 | Luere | H01L 21/68735 |
| 2020/0152431 | A1 * | 5/2020 | Lee | H01J 37/32449 |
| 2020/0161098 | A1 * | 5/2020 | Cui | H01J 37/32715 |
| 2020/0173018 | A1 * | 6/2020 | Hiester | C23C 16/50 |
| 2020/0227238 | A1 * | 7/2020 | Kellogg | H01J 37/32091 |
| 2020/0381216 | A1 * | 12/2020 | Cui | H01J 37/321 |
| 2021/0125813 | A1 * | 4/2021 | Jeong | H01J 37/32642 |
| 2023/0054699 | A1 * | 2/2023 | Marakhtanov | H01J 37/32724 |

FOREIGN PATENT DOCUMENTS

| | | | | | |
|---|---|---|---|---|---|
| JP | 2011135052 | A | | 7/2011 | |
| JP | 201482449 | A | | 5/2014 | |
| JP | 2014150160 | A | | 8/2014 | |
| JP | 2017228526 | A | | 12/2017 | |
| JP | 2019537831 | A | | 12/2019 | |
| KR | 1020190070283 | A | | 6/2019 | |
| WO | WO-2009006062 | A1 | * | 1/2009 | H01J 37/32577 |
| WO | WO-2009006072 | A2 | * | 1/2009 | H01J 37/32091 |
| WO | WO-2014149259 | A1 | * | 9/2014 | H01J 37/32091 |

* cited by examiner (View A-A)

RADIOFREQUENCY SIGNAL FILTER ARRANGEMENT FOR PLASMA PROCESSING SYSTEM

This application is a national stage filing of and claims priority, under 35 U.S.C. § 371, to PCT/US2021/015956, filed on Jan. 30, 2021, which claims the benefit of U.S. Provisional Application No. 62/970,168, filed on Feb. 4, 2020. The entire disclosure of each application referenced above is incorporated herein by reference.

BACKGROUND

1. Field of the Disclosure

The present disclosure relates to semiconductor device fabrication.

2. Description of the Related Art

Plasma etching processes are often used in the manufacture of semiconductor devices on semiconductor wafers. In the plasma etching process, a semiconductor wafer that includes semiconductor devices under manufacture is exposed to a plasma generated within a plasma processing volume. The plasma interacts with material(s) on the semiconductor wafer so as to remove material(s) from the semiconductor wafer and/or modify material(s) to enable their subsequent removal from the semiconductor wafer. The plasma can be generated using specific reactant gases that will cause constituents of the plasma to interact with the material(s) to be removed/modified from the semiconductor wafer, without significantly interacting with other materials on the wafer that are not to be removed/modified. The plasma is generated by using radiofrequency signals to energize the specific reactant gases. These radiofrequency signals are transmitted through the plasma processing volume that contains the reactant gases, with the semiconductor wafer held in exposure to the plasma processing volume. The transmission paths of the radiofrequency signals through the plasma processing volume can affect how the plasma is generated within the plasma processing volume. For example, the reactant gases may be energized to a greater extent in regions of the plasma processing volume where larger amounts of radiofrequency signal power is transmitted, thereby causing spatial non-uniformities in the plasma characteristics throughout the plasma processing volume. The spatial non-uniformities in plasma characteristics can manifest as spatial non-uniformity in ion density, ion energy, and/or reactive constituent density, among other plasma characteristics. The spatial non-uniformities in plasma characteristics can correspondingly cause spatial non-uniformities in plasma processing results on the semiconductor wafer. Therefore, the manner in which radiofrequency signals are transmitted through the plasma processing volume can have an affect on the uniformity of plasma processing results on the semiconductor wafer. It is within this context that the present disclosure arises.

SUMMARY

In an example embodiment, a tunable edge sheath system is disclosed. The tunable edge sheath system includes a coupling ring configured to couple to a bottom surface of an edge ring that surrounds a wafer support area within a plasma processing chamber. The tunable edge sheath system also includes an electrode embedded within the coupling ring. The electrode has an annular shape. The tunable edge sheath system also includes a plurality of radiofrequency signal supply pins coupled to the electrode embedded within the coupling ring. Each of the plurality of radiofrequency signal supply pins extends through a corresponding hole formed through a bottom surface of the coupling ring. The tunable edge sheath system also includes a plurality of radiofrequency signal filters respectively connected to the plurality of radiofrequency supply pins. Each of the plurality of radiofrequency signal filters is configured to provide a high impedance to corresponding radiofrequency signals used to generate a plasma within the plasma processing chamber.

In an example embodiment, a plasma processing system is disclosed. The plasma processing system includes a primary electrode having a substantially cylindrical shape defined by a top surface, a bottom surface, and an outer side surface. The plasma processing system also includes a ceramic layer disposed on the top surface of the primary electrode. The ceramic layer is configured to receive and support a semiconductor wafer. The plasma processing system also includes a radiofrequency signal generator electrically connected through an impedance matching system to the primary electrode. The radiofrequency signal generator is configured to generate and supply radiofrequency signals to the primary electrode. The plasma processing system also includes an edge ring formed of an electrically conductive material and configured to circumscribe the ceramic layer. The edge ring is positioned radially adjacent to the ceramic layer. The plasma processing system also includes a coupling ring coupled to a bottom surface of the edge ring. The coupling ring is formed of an electrical insulator material. The coupling ring includes an embedded electrode. The plasma processing system also includes a plurality of radiofrequency signal supply pins electrically and physically connected to the embedded electrode. Each of the plurality of radiofrequency signal supply pins extends through a corresponding hole formed through a bottom surface of the coupling ring. The plasma processing system also includes a plurality of radiofrequency signal filters respectively connected to the plurality of radiofrequency supply pins. Each of the plurality of radiofrequency signal filters is configured to provide a high impedance to the radiofrequency signals that are supplied to the primary electrode by the radiofrequency signal generator.

DETAILED DESCRIPTION

In the following description, numerous specific details are set forth in order to provide an understanding of embodiments of the present disclosure. It will be apparent, however, to one skilled in the art that embodiments the present disclosure may be practiced without some or all of these specific details. In other instances, well known process operations have not been described in detail in order not to unnecessarily obscure the present disclosure.

In plasma etching systems for semiconductor wafer fabrication, spatial variation of etching results across the semiconductor wafer can be characterized by radial etch uniformity and azimuthal etch uniformity. Radial etch uniformity can be characterized by the variation in etch rate as a function of radial position on the semiconductor wafer, extending outward from the center of the semiconductor wafer to the edge of the semiconductor wafer at a given azimuthal position on the semiconductor wafer. And, azimuthal etch uniformity can be characterized by the variation in etch rate as a function of azimuthal position on the semiconductor wafer, about the center of the semiconductor wafer, at a given radial position on the semiconductor wafer. In some plasma processing systems, such as in the system described herein, the semiconductor wafer is positioned on an electrode from which radiofrequency signals emanate to generate a plasma within a plasma generation region overlying the semiconductor wafer, with the plasma having characteristics controlled to cause a prescribed etching process to occur on the semiconductor wafer.

Figure 1A:
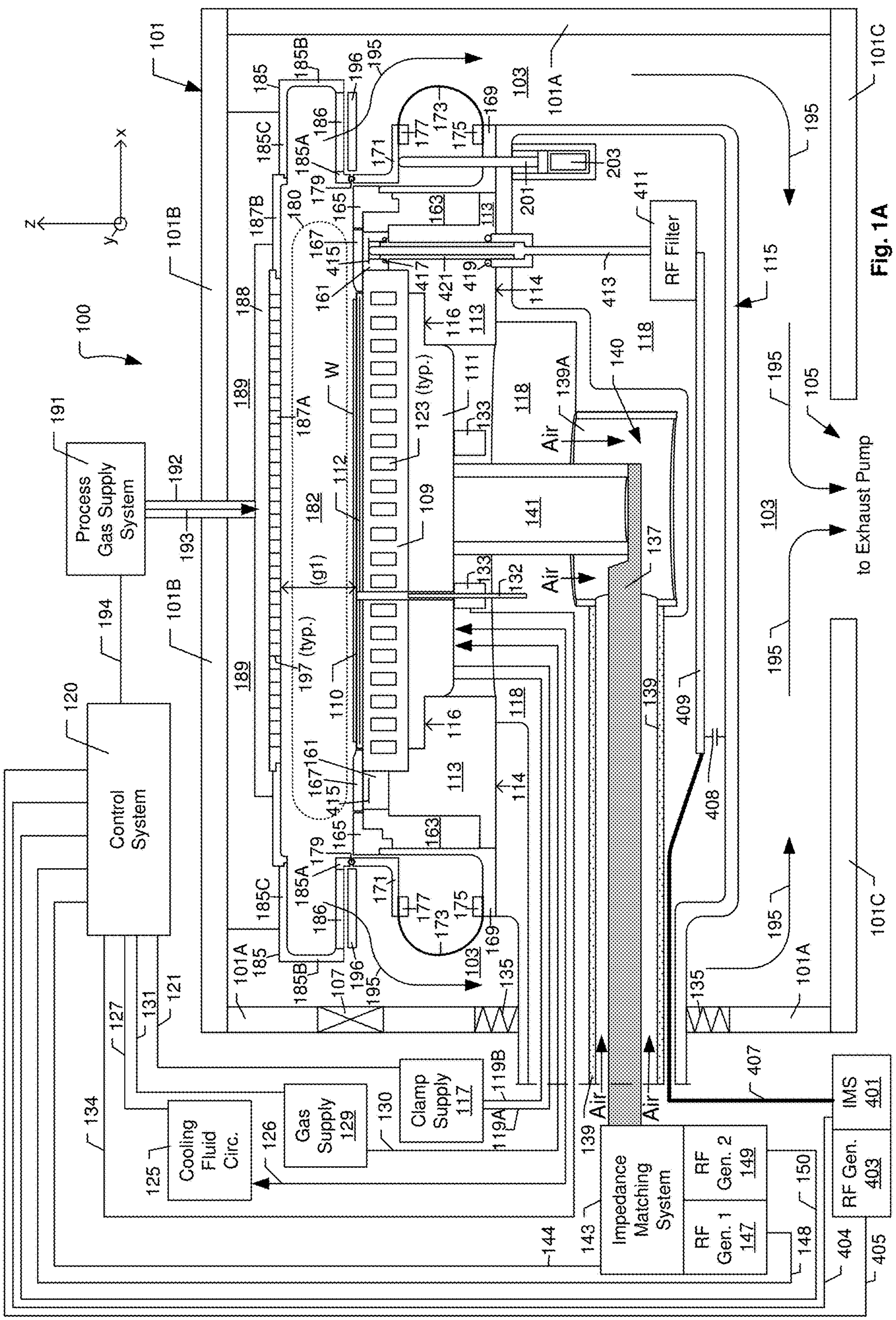
FIG. 1A shows a vertical cross-section view through a plasma processing system for use in semiconductor chip manufacturing, in accordance with some embodiments.

FIG. 1A shows a vertical cross-section view through a plasma processing system 100 for use in semiconductor chip manufacturing, in accordance with some embodiments. The system 100 includes a chamber 101 formed by walls 101A, a top member 101B, and a bottom member 101C. The walls 101A, top member 101B, and bottom member 101C collectively form an interior region 103 within the chamber 101. The bottom member 101C includes an exhaust port 105 through which exhaust gases from plasma processing operations are directed. In some embodiments, during operation, a suction force is applied at the exhaust port 105, such as by a turbo pump or other vacuum device, to draw process exhaust gases out of the interior region 103 of the chamber 101. In some embodiments, the chamber 101 is formed of aluminum. However, in various embodiments, the chamber 101 can be formed of essentially any material that provides sufficient mechanical strength, acceptable thermal performance, and is chemically compatible with the other materials to which it interfaces and to which it is exposed during plasma processing operations within the chamber 101, such as stainless steel, among others. At least one wall 101A of the chamber 101 includes a door 107 through which a semiconductor wafer W is transferred into and out of the chamber 101. In some embodiments, the door 107 is configured as a slit-valve door.

In some embodiments, the semiconductor wafer W is a semiconductor wafer undergoing a fabrication procedure. For ease of discussion, the semiconductor wafer W is referred to as wafer W hereafter. However, it should be understood that in various embodiments, the wafer W can be essentially any type of substrate that is subjected to a plasma-based fabrication process. For example, in some embodiments, the wafer W as referred to herein can be a substrate formed of silicon, sapphire, GaN, GaAs or SiC, or other substrate materials, and can include glass panels/substrates, metal foils, metal sheets, polymer materials, or the like. Also, in various embodiments, the wafer W as referred to herein may vary in form, shape, and/or size. For example, in some embodiments, the wafer W referred to herein may correspond to a circular-shaped semiconductor wafer on which integrated circuit devices are manufactured. In various embodiments, the circular-shaped wafer W can have a diameter of 200 mm (millimeters), 300 mm, 450 mm, or of another size. Also, in some embodiments, the wafer W referred to herein may correspond to a non-circular substrate, such as a rectangular substrate for a flat panel display, or the like, among other shapes.

The plasma processing system 100 includes an electrode 109 positioned on a facilities plate 111. In some embodiments, the electrode 109 and the facilities plate 111 are formed of aluminum. However, in other embodiments, the electrode 109 and the facilities plate 111 can be formed of another electrically conductive material that has sufficient mechanical strength and that has compatible thermal and chemical performance characteristics. A ceramic layer 110 is formed on a top surface of the electrode 109. In some embodiments, the ceramic layer has a vertical thickness of about 1.25 millimeters (mm), as measured perpendicular to the top surface of the electrode 109. However, in other embodiments, the ceramic layer 110 can have a vertical thickness that is either greater than or less than 1.25 mm. The ceramic layer 110 is configured to receive and support the wafer W during performance of plasma processing operations on the wafer W. In some embodiments, the top surface of the electrode 190 that is located radially outside of the ceramic layer 110 and the peripheral side surfaces of the electrode 109 are covered with a spray coat of ceramic.

The ceramic layer 110 includes an arrangement of one or more clamp electrodes 112 for generating an electrostatic force to hold the wafer W to the top surface of the ceramic layer 110. In some embodiments, the ceramic layer 110 includes an arrangement of two clamp electrodes 112 that operate in a bipolar manner to provide a clamping force to the wafer W. The clamp electrodes 112 are connected to a direct current (DC) supply 117 that generates a controlled clamping voltage to hold the wafer W against the top surface of the ceramic layer 110. Electrical wires 119A, 119B are connected between the DC supply 117 and the facilities plate 111. Electrical wires/conductors are routed through the facilities plate 111 and the electrode 109 to electrically connect the wires 119A, 119B to the clamp electrodes 112. The DC supply 117 is connected to a control system 120 through one or more signal conductors 121.

The electrode 109 also includes an arrangement of temperature control fluid channels 123 through which a temperature control fluid is flowed to control a temperature of the electrode 109 and in turn control a temperature of the wafer W. The temperature control fluid channels 123 are plumbed (fluidly connected) to ports on the facilities plate 111. Temperature control fluid supply and return lines are connected to these ports on the facilities plate 111 and to a temperature control fluid circulation system 125, as indicated by arrow 126. The temperature control fluid circulation system 125 includes a temperature control fluid supply, a temperature control fluid pump, and a heat exchanger, among other devices, to provide a controlled flow of temperature control fluid through the electrode 109 in order to obtain and maintain a prescribed wafer W temperature. The temperature control fluid circulation system 125 is connected to the control system 120 through one or more signal conductors 127. In various embodiments, various types of temperature control fluid can be used, such as water or a refrigerant liquid/gas. Also, in some embodiments, the temperature control fluid channels 123 are configured to enable spatially varying control of the temperature of the wafer W, such as in two dimensions (x and y) across the wafer W.

The ceramic layer 110 also includes an arrangement of backside gas supply ports 108 (see FIG. 2) that are fluidly connected to corresponding backside gas supply channels within the electrode 109. The backside gas supply channels within the electrode 109 are routed through the electrode 109 to the interface between the electrode 109 and the facilities plate 111. One or more backside gas supply line(s) are connected to ports on the facilities plate 111 and to a backside gas supply system 129, as indicated by arrow 130. The facilities plate 111 is configured to supply the backside gas(es) from the one or more backside gas supply line(s) to the backside gas supply channels within the electrode 109. The backside gas supply system 129 includes a backside gas supply, a mass flow controller, and a flow control valve, among other devices, to provide a controlled flow of backside gas through the arrangement of backside gas supply ports 108 in the ceramic layer 110. In some embodiments, the backside gas supply system 129 also includes one or more components for controlling a temperature of the backside gas. In some embodiments, the backside gas is helium. Also, in some embodiments, the backside gas supply system 129 can be used to supply clean dry air (CDA) to the arrangement of backside gas supply ports 108 in the ceramic layer 110. The backside gas supply system 129 is connected to the control system 120 through one or more signal conductors 131.

Three lift pins 132 extend through the facilities plate 111, the electrode 109, and the ceramic layer 110 to provide for vertical movement of the wafer W relative to the top surface of the ceramic layer 110. In some embodiments, vertical movement of the lift pins 132 is controlled by a respective electromechanical and/or pneumatic lifting device 133 connected to the facilities plate 111. The three lifting devices 133 are connected to the control system 120 through one or more signal conductors 134. In some embodiments, the three lift pins 132 are positioned to have a substantially equal azimuthal spacing about a vertical centerline of the electrode 109/ceramic layer 110 that extends perpendicular to the top surface of the ceramic layer 110. It should be understood that the lift pins 132 are raised to receive the wafer W into the chamber 101 and to remove the wafer W from the chamber 101, see FIG. 1B. Also, the lift pins 132 are lowered to allow the wafer W to rest on the top surface of the ceramic layer 110 during processing of the wafer W.

Figure 2:
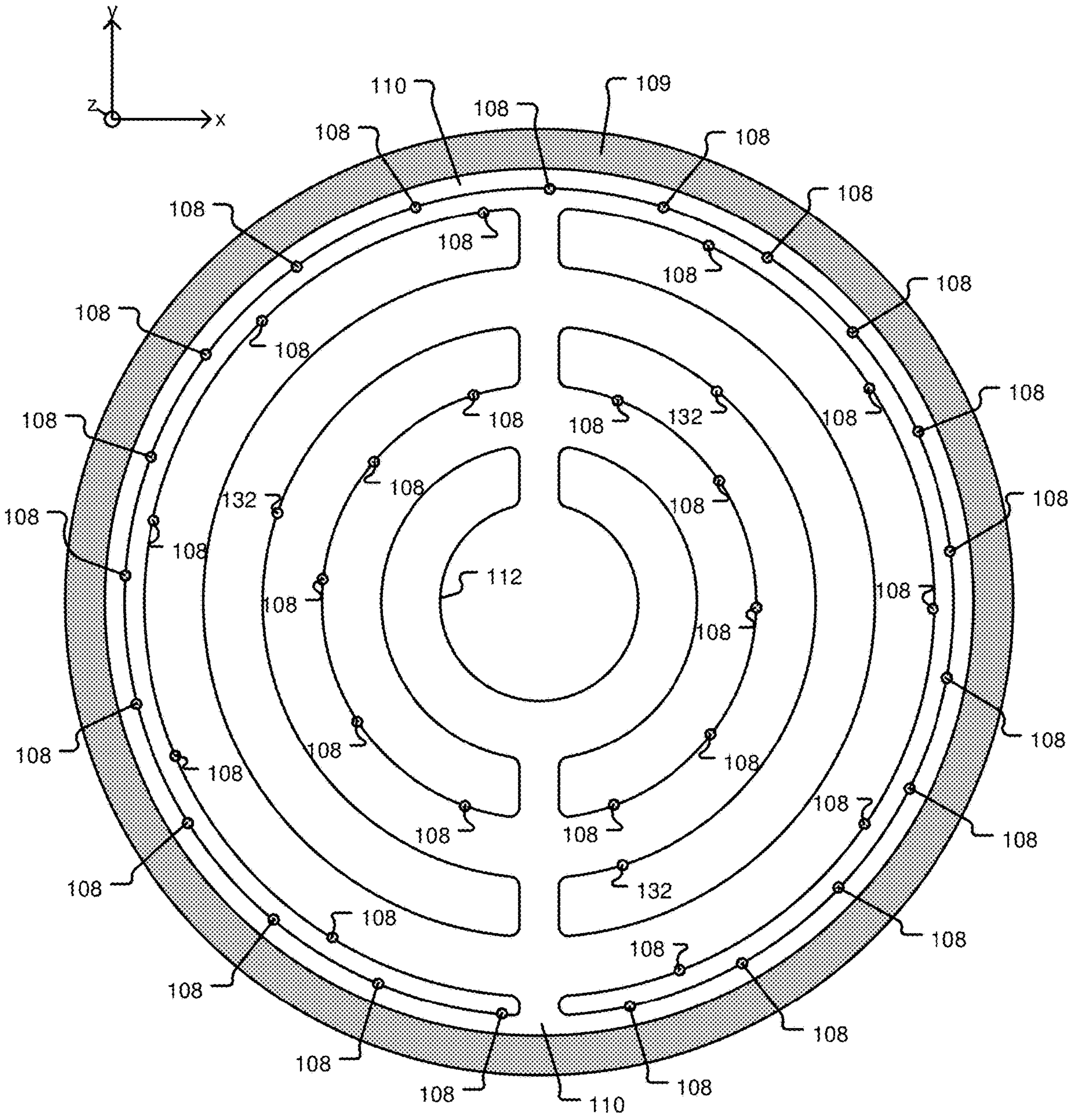
FIG. 2 shows a top view of the ceramic layer and electrode, in accordance with some embodiments.

FIG. 2 shows a top view of the ceramic layer 110 and electrode 109, in accordance with some embodiments. An example arrangement of the clamp electrode(s) 112 is shown within the ceramic layer 110. It should be understood that the clamp electrode(s) 112 are disposed within a vertical thickness of the ceramic layer 110, such that a portion of the ceramic layer 110 is present above the clamp electrode(s) 112. FIG. 2 also shows an example arrangement of the backside gas supply ports 108. It should be understood that the number and spatial arrangement of the backside gas supply ports 108 can vary in different embodiments. In some embodiments, the backside gas supply ports 108 are filled with a porous ceramic material that allows for flow of the backside gas through the backside gas supply ports 108 while also providing a solid surface at the locations of the backside gas supply ports 108. FIG. 2 also shows an example arrangement of three lift pins 132.

Also, in various embodiments, one or more of the electrode 109, the facilities plate 111, the ceramic layer 110, the clamp electrodes 112, the lift pins 132, or essentially any other component associated therewith can be equipped to include one or more sensors, such as sensors for temperature measurement, electrical voltage measurement, and electrical current measurement, among others. Any sensor disposed within the electrode 109, the facilities plate 111, the ceramic layer 110, the clamp electrodes 112, the lift pins 132, or essentially any other component associated therewith is connected to the control system 120 by way of electrical wire, optical fiber, or through a wireless connection.

The facilities plate 111 is set within an opening of a ceramic support 113, and is supported by the ceramic support 113. The ceramic support 113 is positioned on a supporting surface 114 of a cantilever arm assembly 115. In some embodiments, the ceramic support 113 has a substantially annular shape, such that the ceramic support 113 substantially circumscribes the outer radial perimeter of the facilities plate 111, while also providing a supporting surface 116 upon which a bottom outer peripheral surface of the facilities plate 111 rests. The cantilever arm assembly 115 extends through the wall 101A of the chamber 101. In some embodiments, a sealing mechanism 135 is provided within the wall 101A of the chamber 101 where the cantilever arm assembly 115 is located to provide for sealing of the interior region 103 of the chamber 101, while also enabling the cantilever arm assembly 115 to move upward and downward in the z-direction in a controlled manner.

The cantilever arm assembly 115 has an open region 118 through which various devices, wires, cables, and tubing is routed to support operations of the system 100. The open region 118 within the cantilever arm assembly is exposed to ambient atmospheric conditions outside of the chamber 101, e.g., air composition, temperature, pressure, and relative humidity. Also, a radiofrequency signal supply rod 137 is positioned inside of the cantilever arm assembly 115. More specifically, the radiofrequency signal supply rod 137 is positioned inside of an electrically conductive tube 139, such that the radiofrequency signal supply rod 137 is spaced apart from the inner wall of the tube 139. The sizes of the radiofrequency signal supply rod 137 and the tube 139 may vary. The region inside of the tube 139 between the inner wall of the tube 139 and the radiofrequency signal supply rod 137 is occupied by air along the full length of the tube 139. In some embodiments, the outer diameter ($D_{rod}$) of the radiofrequency signal supply rod 137 and the inner diameter of the tube 139 ($D_{tube}$) are set to satisfy the relationship $\ln(D_{tube}/D_{rod})>=e^1$.

In some embodiments, the radiofrequency signal supply rod 137 is substantially centered within the tube 139, such that a substantially uniform radial thickness of air exists between the radiofrequency signal supply rod 137 and the inner wall of the tube 139, along the length of tube 139. However, in some embodiments, the radiofrequency signal supply rod 137 is not centered within the tube 139, but the air gap within the tube 139 exists at all locations between the radiofrequency signal supply rod 137 and the inner wall of the tube 139, along the length of the tube 139. A delivery end of the radiofrequency signal supply rod 137 is electrically and physically connected to a lower end of a radiofrequency signal supply shaft 141. In some embodiments, the delivery end of the radiofrequency signal supply rod 137 is bolted to a lower end of a radiofrequency signal supply shaft 141. An upper end of the radiofrequency signal supply shaft 141 is electrically and physically connected to the bottom the facilities plate 111. In some embodiments, the upper end of the radiofrequency signal supply shaft 141 is bolted to the bottom the facilities plate 111. In some embodiments, both the radiofrequency signal supply rod 137 and the radiofrequency signal supply shaft 141 are formed of copper. In some embodiments, the radiofrequency signal supply rod 137 is formed of copper, or aluminum, or anodized aluminum. In some embodiments, the radiofrequency signal supply shaft 141 is formed of copper, or aluminum, or anodized aluminum. In other embodiments, the radiofrequency signal supply rod 137 and/or the radiofrequency signal supply shaft 141 is formed of another electrically conductive material that provides for transmission of radiofrequency electrical signals. In some embodiments, the radiofrequency signal supply rod 137 and/or the radiofrequency signal supply shaft 141 is coated with an electrically conductive material (such as silver or another electrically conductive material) that provides for transmission of radiofrequency electrical signals. Also, in some embodiments, the radiofrequency signal supply rod 137 is a solid rod. However, in other embodiments, the radiofrequency signal supply rod 137 is a tube. Also, it should be understood that a region 140 surrounding the connection between the radiofrequency signal supply rod 137 and the radiofrequency signal supply shaft 141 is occupied by air.

A supply end of the radiofrequency signal supply rod 137 is connected electrically and physically to an impedance matching system 143. The impedance matching system 143 is connected to a first radiofrequency signal generator 147 and a second radiofrequency signal generator 149. The impedance matching system 143 is also connected to the control system 120 through one or more signal conductors 144. The first radiofrequency signal generator 147 is also connected to the control system 120 through one or more signal conductors 148. The second radiofrequency signal generator 149 is also connected to the control system 120 through one or more signal conductors 150. The impedance matching system 143 includes an arrangement of inductors and capacitors sized and connected to provide for impedance matching so that radiofrequency power can be transmitted along the radiofrequency signal supply rod 137, along the radiofrequency signal supply shaft 141, through the facilities plate 111, through the electrode 109, and into a plasma processing region 182 above the ceramic layer 110. In some embodiments, the first radiofrequency signal generator 147 is a high frequency radiofrequency signal generator, and the second radiofrequency signal generator 149 is a low frequency radiofrequency signal generator. In some embodiments, the first radiofrequency signal generator 147 generates radiofrequency signals within a range extending from about 50 MegaHertz (MHz) to about 70 MHz, or within a range extending from about 54 MHz to about 63 MHz, or at about 60 MHz. In some embodiments, the first radiofrequency signal generator 147 supplies radiofrequency power within a range extending from about 5 kiloWatts (kW) to about 25 kW, or within a range extending from about 10 kW to about 20 kW, or within a range extending from about 15 kW to about 20 kW, or of about 10 kW, or of about 16 kW. In some embodiments, the second radiofrequency signal generator 149 generates radiofrequency signals within a range extending from about 50 kiloHertz (kHz) to about 500 kHz, or within a range extending from about 330 kHz to about 440 kHz, or at about 400 kHz. In some embodiments, the second radiofrequency signal generator 149 supplies radiofrequency power within a range extending from about 15 kW to about 100 kW, or within a range extending from about 30 kW to about 50 kW, or of about 34 kW, or of about 50 kW. In an example embodiment, the first radiofrequency signal generator 147 is set to generate radiofrequency signals having a frequency of about 60 MHz, and the second radiofrequency signal generator 149 is set to generate radiofrequency signals having a frequency of about 400 kHz.

Figure 3A:
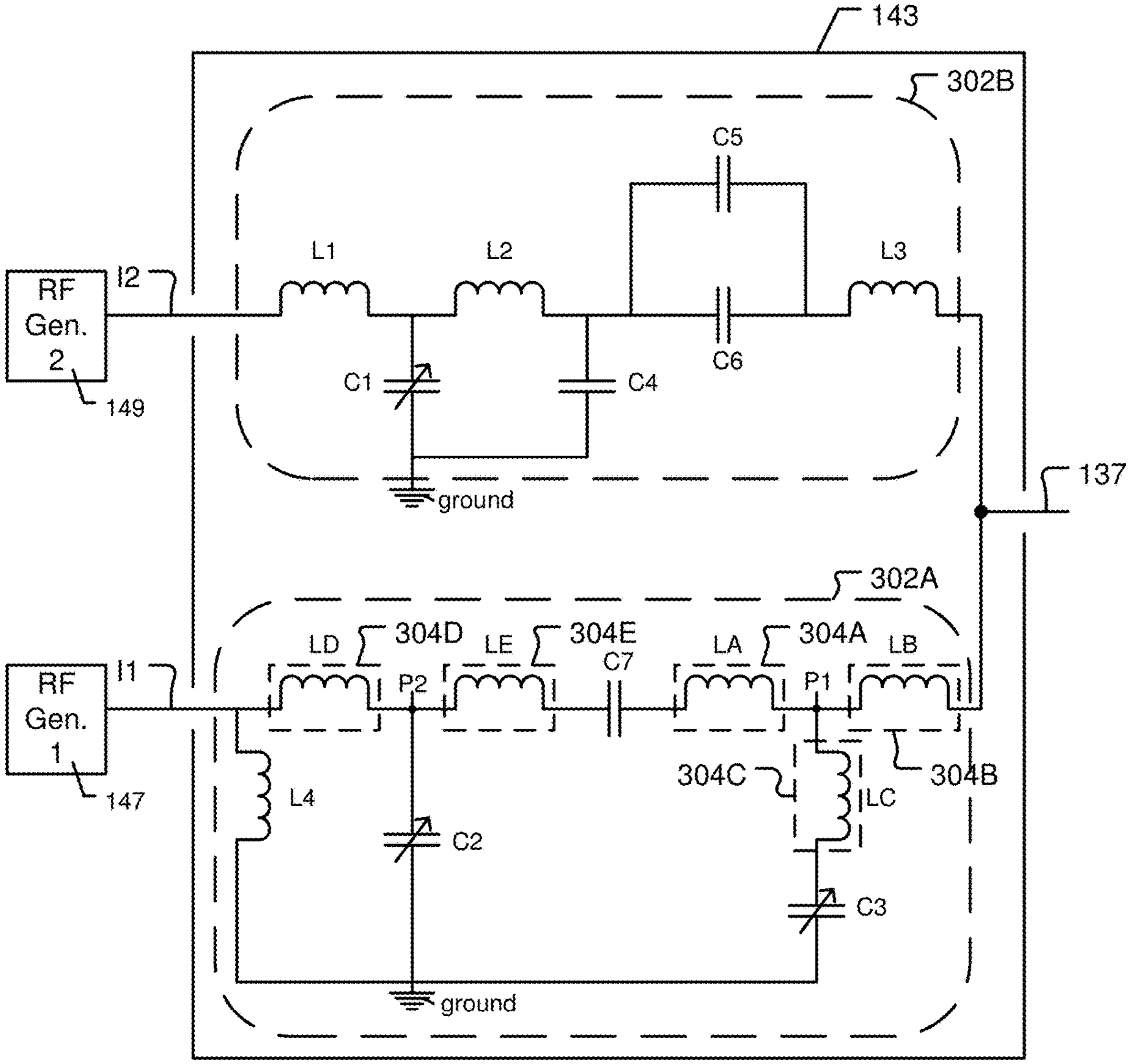
FIG. 3A shows an electrical schematic of the impedance matching system, in accordance with some embodiments.

FIG. 3A shows an electrical schematic of the impedance matching system 143, in accordance with some embodiments. The impedance matching system 143 includes a first branch 302A (high frequency branch) and a second branch 302B (low frequency branch). The first branch 302A includes circuit components, such as an inductor L4, a capacitor C2, a capacitor C7, and a capacitor C3. The second branch 302B includes circuit components, such as an inductor L1, an inductor L2, a capacitor C1, a capacitor C4, a capacitor C5, a capacitor C6, and an inductor L3. In some embodiments, the capacitors C1, C2, and C3 are variable capacitors. The capacitors C1 and C2 are main capacitors, and capacitor C3 is an auxiliary capacitor. Each of the inductors L1, L2, L3, and L4 is formed as a coil of electrically conductive material, e.g., copper. The first branch 302A has an input I1 connected to the output of the first radiofrequency signal generator 147. The second branch 302B has an input I2 connected to the output of the second radiofrequency signal generator 149. The input I2 is connected to the inductor L1.

By way of example, an RF strap as referenced herein is a flat elongated piece of metal that is made from an electrically conductive material, such as copper. Therefore, the RF strap has a length, a width, and a thickness. The length of the RF strap is greater than the width of the RF strap. And, the width of the RF strap is greater than the thickness of the RF strap. In some embodiments, the RF strap is flexible to provide for bending or re-shaping of the RF strap.

The first branch 302A includes an RF strap portion 304A (represented as inductor LA), an RF strap portion 304B (represented as inductor LB), an RF strap 304C (represented as inductor LC), an RF strap 304D (represented as inductor LD), and an RF strap 304E (represented as inductor LE). In some embodiments, the RF strap portions 304A and 304B are respective parts of one RF strap, such that inductors LA and LB represent separate portions of one RF strap. However, in some embodiments, instead of having one RF strap that includes the two RF strap portions 304A and 304B, two separate RF straps are used for the RF strap portions 304A and 304B, respectively. For example, a first RF strap having an inductance of the RF strap portion 304A is connected via an electrically conductive connector to a second RF strap having an inductance of the RF strap portion 304B.

The capacitor C3 is coupled via the RF strap 304C to a prescribed position P1 on the RF strap that includes both the RF strap portions 304A and 304B. In this manner, the prescribed position P1 at which the RF strap 304C connects to the RF strap that includes both the RF strap portions 304A and 304B is what determines the respective lengths of the RF strap portions 304A and 304B. Also, the capacitor C7 is coupled to an end of the RF strap portion 304A opposite from the prescribed position P1. The prescribed position P1 is coupled via the RF strap portion 304B to the radiofrequency signal supply rod 137. The RF straps 304D and 304E are coupled together at a prescribed position P2. The capacitor C2 also has a terminal connected to the prescribed position P2. The RF strap 304D is coupled to the inductor L4 and to an input I1 of the impedance matching system 143. Each RF strap portion 304A and 304B, and each RF strap 304C, 304D, and 304E has a respective inductance. For example, the RF strap portion 304A has an inductance LA, the RF strap portion 304B as another inductance LB, the RF strap 304C has another inductance LC, the RF strap 304D has an inductance LD, and the RF strap 304E has an inductance LE. It should be noted that any RF strap, described herein, such as any of the RF straps 304A-304E, are not wound into a coil to form an inductor but is a flat elongated piece of metal.

In various embodiments, any of the capacitors and/or non-strap inductors shown in FIG. 3A can be either fixed or variable. For example, in various embodiments, any one or more of the capacitors C4 through C7 is a fixed capacitor, meaning that its inductance is not changeable/tunable. And, in some embodiments, any one or more of the capacitors C4 through C7 is a variable capacitor, meaning that its capacitance can be changed/tuned. In various embodiments, any one or more of the inductors L1 through L4 is a fixed inductor, meaning that its inductance is not changeable/tunable. Also, in various embodiments, any one or more of the inductors L1 through L4 is a variable inductor, meaning that its inductance can be changed/tuned.

With reference back to FIG. 1A, a coupling ring 161 is configured and positioned to extend around the outer radial perimeter of the electrode 109. In some embodiments, the coupling ring 161 is formed of a ceramic material. A quartz ring 163 is configured and positioned to extend around the outer radial perimeters of both the coupling ring 161 and the ceramic support 113. In some embodiments, the coupling ring 161 and the quartz ring 163 are configured to have substantially aligned top surfaces when the quartz ring 163 is positioned around both the coupling ring 161 and the ceramic support 113. Also, in some embodiments, the substantially aligned top surfaces of the coupling ring 161 and the quartz ring 163 are substantially aligned with a top surface of the electrode 109, said top surface being present outside of the radial perimeter of the ceramic layer 110. Also, in some embodiments, a cover ring 165 is configured and positioned to extend around the outer radial perimeter of the top surface of the quartz ring 163. In some embodiments, the cover ring 165 is formed of quartz. In some embodiments, the cover ring 165 is configured to extend vertically above the top surface of the quartz ring 163. In this manner, the cover ring 165 provides a peripheral boundary within which an edge ring 167 is positioned.

The edge ring 167 is configured to facilitate extension of the plasma sheath radially outward beyond the peripheral edge of the wafer W to provide improvement in process results near the periphery of the wafer W. In various embodiments, the edge ring 167 is formed of a conductive material, such as crystalline silicon, polycrystalline silicon (polysilicon), boron doped single crystalline silicon, aluminum oxide, quartz, aluminum nitride, silicon nitride, silicon carbide, or a silicon carbide layer on top of an aluminum oxide layer, or an alloy of silicon, or a combination thereof, among other materials. It should be understood that the edge ring 167 is formed as an annular-shaped structure, e.g., as a ring-shaped structure. The edge ring 167 can perform many functions, including shielding components underlying the edge ring 167 from being damaged by ions of a plasma 180 formed within a plasma processing region 182. Also, the edge ring 167 improves uniformity of the plasma 180 at and along the outer peripheral region of the wafer W.

Figure 4:
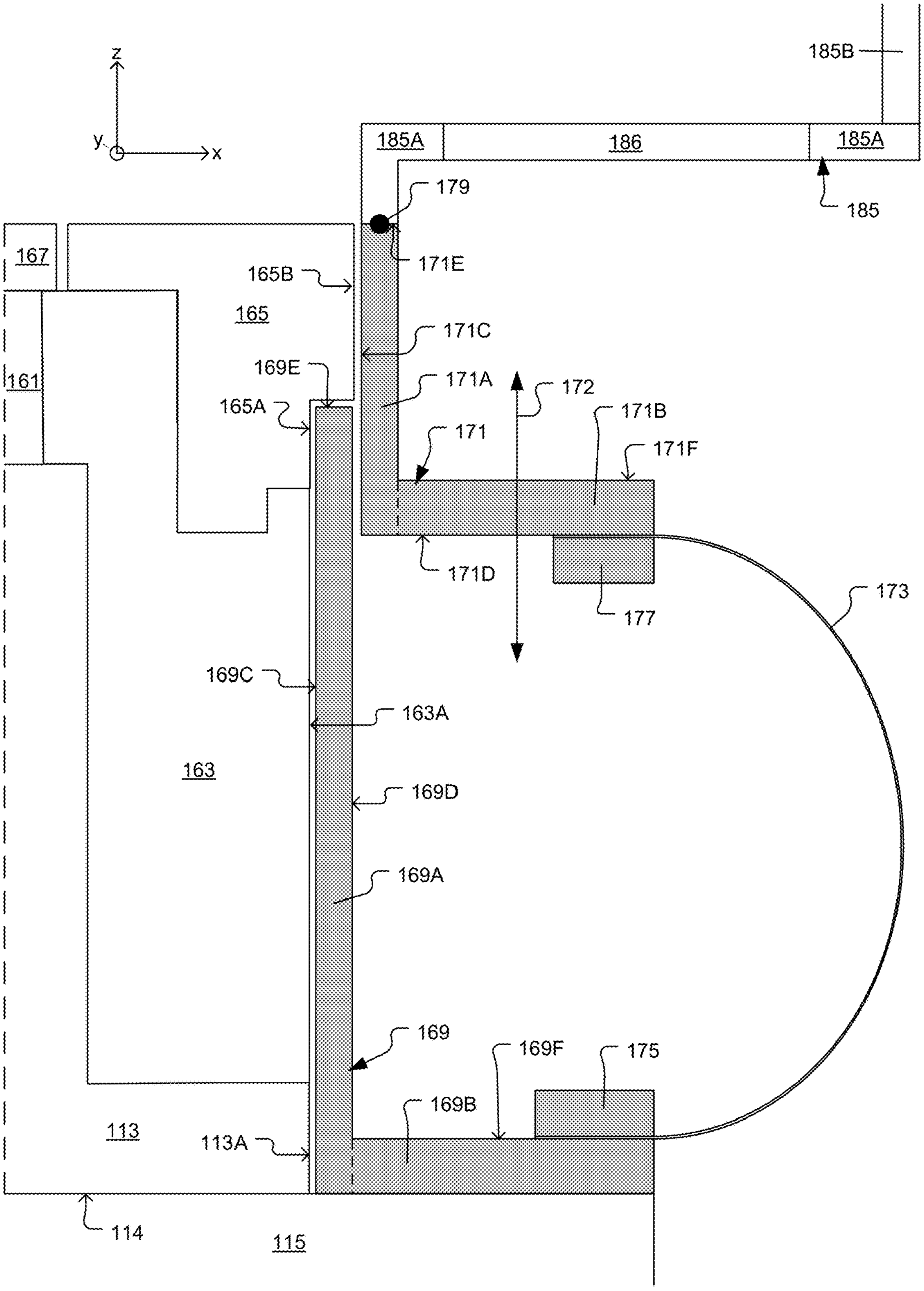
FIG. 4 shows a close-up view of a vertical cross-section through the fixed outer support flange, in accordance with some embodiments.

A fixed outer support flange 169 is attached to the cantilever arm assembly 115. FIG. 4 shows a close-up view of a vertical cross-section through the fixed outer support flange 169, in accordance with some embodiments. The fixed outer support flange 169 is configured to extend around an outer vertical side surface 113A of the ceramic support 113, and around an outer vertical side surface 163A of the quartz ring 163, and around a lower outer vertical side surface 165A of the cover ring 165. The fixed outer support flange 169 has an annular shape that circumscribes the assembly of the ceramic support 113, the quartz ring 163, and the cover ring 165. The fixed outer support flange 169 has an L-shaped vertical cross-section that includes a vertical portion 169A and a horizontal portion 169B. The vertical portion 169A of the L-shaped cross-section of the fixed outer support flange 169 has an inner vertical surface 169C that is positioned against the outer vertical side surface 113A of the ceramic support 113, and against the outer vertical side surface 163A of the quartz ring 163, and against the lower outer vertical side surface 165A of the cover ring 165. In some embodiments, the vertical portion 169A of the L-shaped cross-section of the fixed outer support flange 169 extends over an entirety of the outer vertical side surface 113A of the ceramic support 113, and over an entirety of the outer vertical side surface 163A of the quartz ring 163, and over the lower outer vertical side surface 165A of the cover ring 165. In some embodiments, the cover ring 165 extends radially outward above a top surface 169E of the vertical portion 169A of the L-shaped cross-section of the fixed outer support flange 169. And, in some embodiments, an upper outer vertical side surface 165B of the cover ring 165 (located above the top surface 169E of the vertical portion 169A of the L-shaped cross-section of the fixed outer support flange 169) is substantially vertically aligned with an outer vertical surface 169D of the vertical portion 169A of the L-shaped cross-section of the fixed outer support flange 169. The horizontal portion 169B of the L-shaped cross-section of the fixed outer support flange 169 is positioned on and fastened to the supporting surface 114 of a cantilever arm assembly 115. The fixed outer support flange 169 is formed of an electrically conductive material. In some embodiments, the fixed outer support flange 169 is formed of aluminum or anodized aluminum. However, in other embodiments, the fixed outer support flange 169 can be formed of another electrically conductive material, such as copper or stainless steel. In some embodiments, the horizontal portion 169B of the L-shaped cross-section of the fixed outer support flange 169 is bolted to the supporting surface 114 of a cantilever arm assembly 115.

An articulating outer support flange 171 is configured and positioned to extend around the outer vertical surface 169D of the vertical portion 169A of the L-shaped cross-section of the fixed outer support flange 169, and to extend around the upper outer vertical side surface 165B of the cover ring 165. The articulating outer support flange 171 has an annular shape that circumscribes both the vertical portion 169A of the L-shaped vertical cross-section of the fixed outer support flange 169 and the upper outer vertical side surface 165B of the cover ring 165. The articulating outer support flange 171 has an L-shaped vertical cross-section that includes a vertical portion 171A and a horizontal portion 171B. The vertical portion 171A of the L-shaped cross-section of the articulating outer support flange 171 has an inner vertical surface 171C that is positioned proximate to and spaced apart from both the outer vertical side surface 169D of the vertical portion 169A of the L-shaped cross-section of the fixed outer support flange 169 and the upper outer vertical side surface 165B of the cover ring 165. In this manner, the articulating outer support flange 171 is movable in the vertical direction (z-direction) along both the vertical portion 169A of the L-shaped vertical cross-section of the fixed outer support flange 169 and the upper outer vertical side surface 165B of the cover ring 165, as indicated by arrow 172. The articulating outer support flange 171 is formed of an electrically conductive material. In some embodiments, the articulating outer support flange 171 is formed of aluminum or anodized aluminum. However, in other embodiments, the articulating outer support flange 171 can be formed of another electrically conductive material, such as copper or stainless steel.

Figure 5:
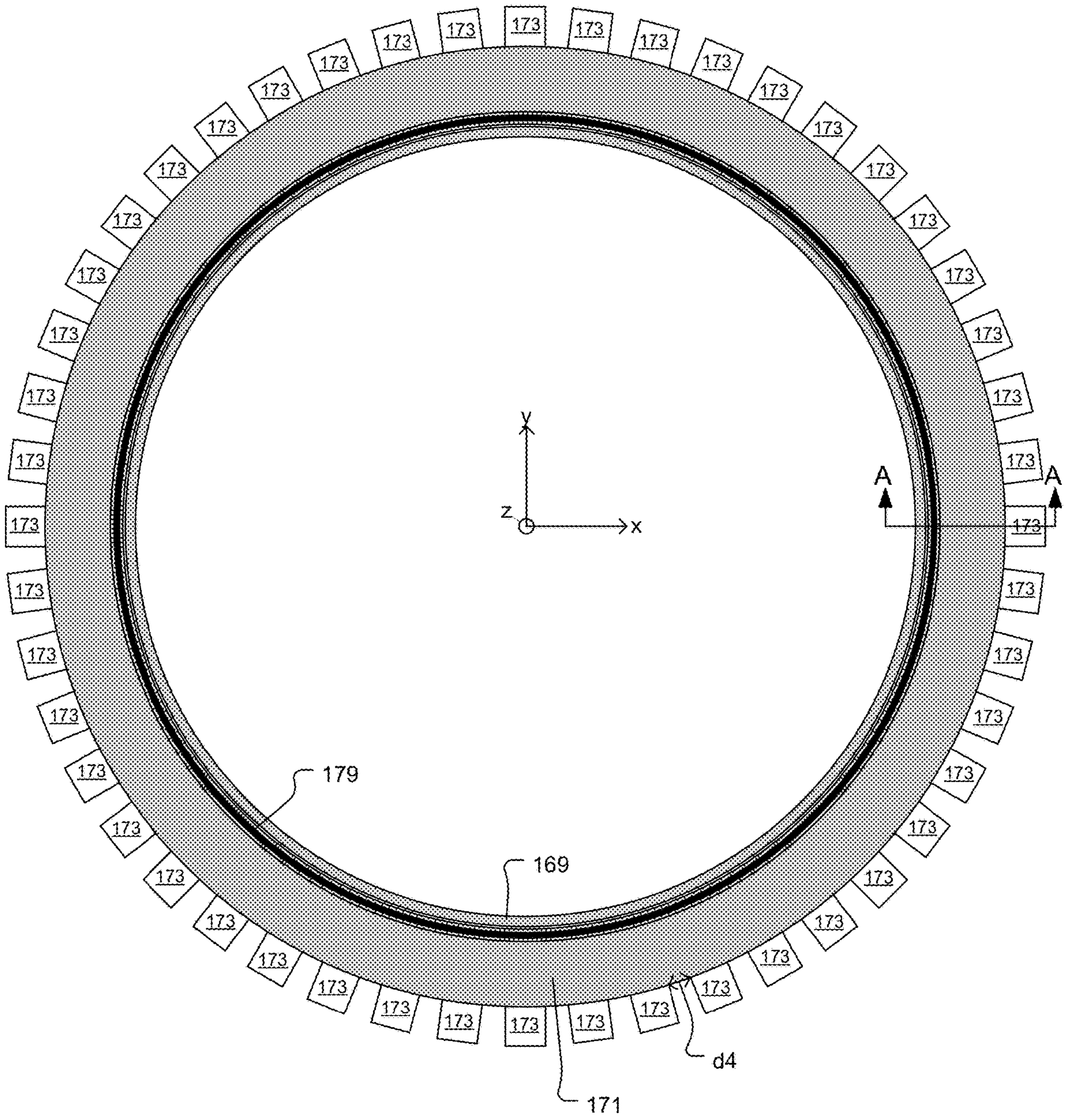
FIG. 5 shows a top view of the articulating outer support flange and the fixed outer support flange, with the number of electrically conductive straps connected between the articulating outer support flange and the fixed outer support flange, in accordance with some embodiments.
Figure 6:
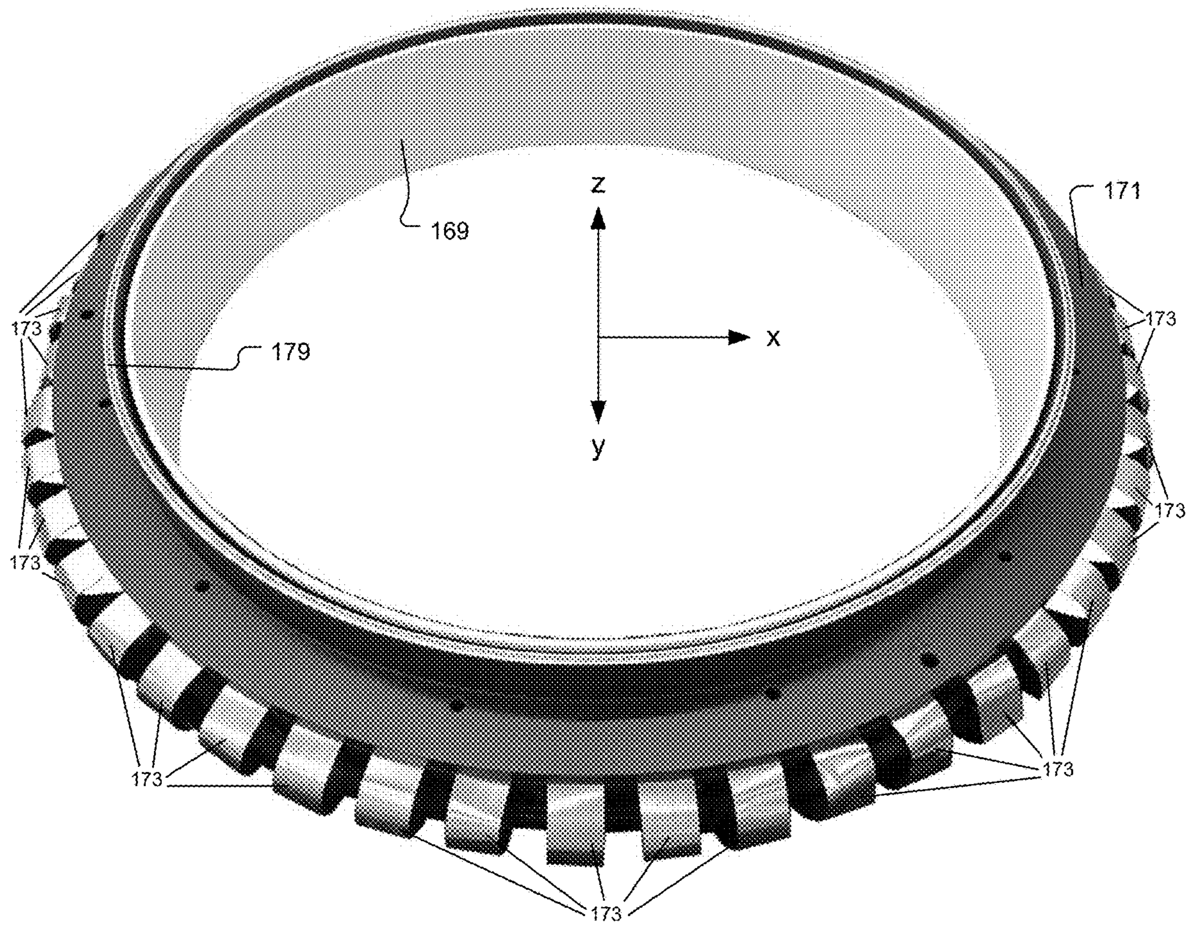
FIG. 6 shows a perspective view of the top of the articulating outer support flange and the fixed outer support flange, with the number of electrically conductive straps connected between the articulating outer support flange and the fixed outer support flange, in accordance with some embodiments.

A number of electrically conductive straps 173 are connected between the articulating outer support flange 171 and the fixed outer support flange 169, around the outer radial perimeters of both the articulating outer support flange 171 and the fixed outer support flange 169. In the example embodiments of FIGS. 1A, 1B, 4A, 4B, 5, and 6, the electrically conductive straps 173 are shown to have an "outward" configuration, in that the electrically conductive straps 173 bend outward away from the fixed outer support flange 169. FIG. 5 shows a top view of the articulating outer support flange 171 and the fixed outer support flange 169, with the number of electrically conductive straps 173 connected between the articulating outer support flange 171 and the fixed outer support flange 169, in accordance with some embodiments. FIG. 6 shows a perspective view of the top of the articulating outer support flange 171 and the fixed outer support flange 169, with the number of electrically conductive straps 173 connected between the articulating outer support flange 171 and the fixed outer support flange 169, in accordance with some embodiments. In some embodiments, the electrically conductive straps 173 are formed of stainless steel. However, in other embodiments, the electrically conductive straps 173 can be formed of another electrically conductive material, such as aluminum or copper, among others.

Figure 7:
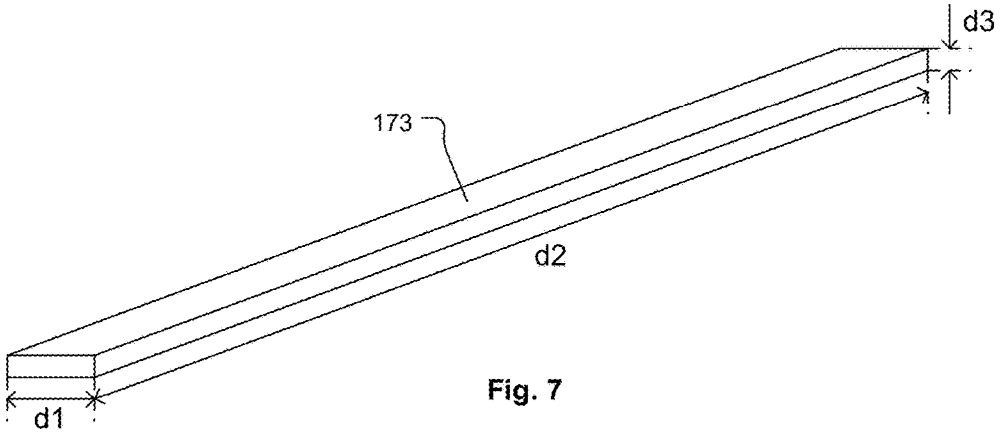
FIG. 7 shows an isometric view of an electrically conductive strap, in accordance with some embodiments.

In the examples of FIGS. 1A, 1B, 5, and 6, forty-eight (48) electrically conductive straps 173 are distributed in a substantially equally spaced manner around the outer radial perimeters of the articulating outer support flange 171 and the fixed outer support flange 169. It should be understood, however, that the number of electrically conductive straps 173 can vary in different embodiments. In some embodiments, the number of electrically conductive straps 173 is within a range extending from about 24 to about 80, or within a range extending from about 36 to about 60, or within a range extending from about 40 to about 56. In some embodiments, the number of electrically conductive straps 173 is less than 24. In some embodiments, the number of electrically conductive straps 173 is greater than 80. Because the number of electrically conductive straps 173 has an effect on the ground return paths for the radiofrequency signals around the perimeter of the plasma processing region 182, the number of electrically conductive straps 173 can have an effect on the uniformity of process results across the wafer W. Also, the size of the electrically conductive straps 173 can vary in different embodiments. FIG. 7 shows an isometric view of an electrically conductive strap 173, in accordance with some embodiments. The electrically conductive strap 173 has a rectangular prism shape defined by a width (d1), a length (d2), and a thickness (d3).

Also, FIG. 5 shows an azimuthal spacing (d4) between adjacent electrically conductive straps 173, when connected between the articulating outer support flange 171 and the fixed outer support flange 169. In some embodiments, the electrical conductive straps 173 are positioned in a substantially equally spaced manner around the outer perimeter of the articulating outer support flange 171, and similarly around the outer perimeter of the fixed outer support flange 169. Therefore, in these embodiments, the azimuthal spacing (d4) between adjacent electrical conductive straps 173 around the outer perimeter of the horizontal portion 171B of the L-shaped vertical cross-section of the articulating outer support flange 171 is dependent upon the number of electrically conductive straps 173, the width dimension (d1) of the electrically conductive strap 173, and the outer diameter of the horizontal portion 171B of the L-shaped vertical cross-section of the articulating outer support flange 171. Similarly, the azimuthal spacing (d4) between adjacent electrical conductive straps 173 around the outer perimeter of the horizontal portion 169B of the L-shaped vertical cross-section of the fixed outer support flange 169 is dependent upon the number of electrically conductive straps 173, the width dimension (d1) of the electrically conductive strap 173, and the outer diameter of the horizontal portion 169B of the L-shaped vertical cross-section of the fixed outer support flange 169.

In some embodiments, the electrically conductive straps 173 are connected to the fixed outer support flange 169 by a clamping force applied by securing a clamp ring 175 to a top surface 169F of the horizontal portion 169B of the L-shaped cross-section of the fixed outer support flange 169. In some embodiments, the clamp ring 175 is bolted to the fixed outer support flange 169. In some embodiments, the bolts that secure the clamp ring 175 to the fixed outer support flange 169 are positioned at locations between the electrically conductive straps 173. However, in some embodiments, one or more bolts that secure the clamp ring 175 to the fixed outer support flange 169 can be positioned to extend through electrically conductive straps 173. In some embodiments, the clamp ring 175 is formed of a same material as the fixed outer support flange 169. However, in other embodiments, the clamp ring 175 and the fixed outer support flange 169 can be formed of different materials.

In some embodiments, such as shown in FIG. 4A, the electrically conductive straps 173 are connected to the articulating outer support flange 171 by a clamping force applied by securing a clamp ring 177 to a bottom surface 171D of the horizontal portion 171B of the L-shaped cross-section of the articulating outer support flange 171. Alternatively, in some embodiments, the first end portion of each of the plurality of electrically conductive straps 173 is connected to the upper surface 171F of the horizontal portion 171B of the articulating outer support flange 171 by the clamp ring 177. In some embodiments, the clamp ring 177 is bolted to the articulating outer support flange 171. In some embodiments, the bolts that secure the clamp ring 177 to the articulating outer support flange 171 are positioned at locations between the electrically conductive straps 173. However, in some embodiments, one or more bolts that secure the clamp ring 177 to the articulating outer support flange 171 can be positioned to extend through electrically conductive straps 173. In some embodiments, the clamp ring 177 is formed of a same material as the articulating outer support flange 171. However, in other embodiments, the clamp ring 177 and the articulating outer support flange 171 can be formed of different materials.

A set of support rods 201 are positioned around the cantilever arm assembly 115 to extend vertically through the horizontal portion 169B of the L-shaped cross-section of the fixed outer support flange 169. The upper end of the support rods 201 are configured to engage with the bottom surface 171D of the horizontal portion 171B of the L-shaped cross-section of the articulating outer support flange 171. In some embodiments, a lower end of each of the support rods 201 is engaged with a resistance mechanism 203. The resistance mechanism 203 is configured to provide an upward force to the corresponding support rod 201 that will resist downward movement of the support rod 201, while allowing some downward movement of the support rod 201. In some embodiments, the resistance mechanism 203 includes a spring to provide the upward force to the corresponding support rod 201. In some embodiments, the resistance mechanism 203 includes a material, e.g., spring and/or rubber, that has a sufficient spring constant to provide the upward force to the corresponding support rod 201. It should be understood that as the articulating outer support flange 171 moves downward to engage the set of support rods 201, the set of support rods 201 and corresponding resistance mechanisms 203 provide an upward force to the articulating outer support flange 171. In some embodiments, the set of support rods 201 includes three support rods 201 and corresponding resistance mechanisms 203. In some embodiments, the support rods 201 are positioned to have a substantially equal azimuthal spacing relative to a vertical centerline of the electrode 109. However, in other embodiments, the support rods 201 are positioned to have a non-equal azimuthal spacing relative to a vertical centerline of the electrode 109. Also, in some embodiments, more than three support rods 201 and corresponding resistance mechanisms 203 are provided to support the articulating outer support flange 171.

With reference back to FIG. 1A, the plasma processing system 100 further includes a C-shroud member 185 positioned above the electrode 109. The C-shroud member 185 is configured to interface with the articulating outer support flange 171. Specifically, a seal 179 is disposed on the top surface 171E of the horizontal portion 171B of the L-shaped cross-section of the articulating outer support flange 171, such that the seal 179 is engaged by the C-shroud member 185 when the articulating outer support flange 171 is moved upward toward the C-shroud member 185. In some embodiments, the seal 179 is electrically conductive to assist with establishing electrical conduction between the C-shroud member 185 and the articulating outer support flange 171. In some embodiments, the C-shroud member 185 is formed of polysilicon. However, in other embodiments, the C-shroud member 185 is formed of another type of electrically conductive material that is chemically compatible with the processes to be formed in the plasma processing region 182, and that has sufficient mechanical strength.

The C-shroud is configured to extend around the plasma processing region 182 and provide a radial extension of the plasma processing region 182 volume into the region defined within the C-shroud member 185. The C-shroud member 185 includes a lower wall 185A, an outer vertical wall 185B, and an upper wall 185C. In some embodiments, the outer vertical wall 185B and the upper wall 185C of the C-shroud member 185 are solid, non-perforated members, and the lower wall 185A of the C-shroud member 185 includes a number of vents 186 through which process gases flow from within the plasma processing region 182. In some embodiments, a throttle member 196 is disposed below the vents 186 of the C-shroud member 185 to control a flow of process gas through the vents 186. More specifically, in some embodiments, the throttle member 196 is configured to move up and down vertically in the z-direction relative to the C-shroud member 185 to control the flow of process gas through the vents 186. In some embodiments, the throttle member 196 is configured to engage with and/or enter the vents 186.

The upper wall 185C of the C-shroud member 185 is configured to support an upper electrode 187A/187B. In some embodiments, the upper electrode 187A/187B includes an inner upper electrode 187A and an outer upper electrode 187B. Alternatively, in some embodiments, the inner upper electrode 187A is present and the outer upper electrode 187B is not present, with the inner upper electrode 187A extending radially to cover the location that would be occupied by the outer upper electrode 187B. In some embodiments, the inner upper electrode 187A is formed of single crystal silicon and the outer upper electrode 187B is formed of polysilicon. However, in other embodiments, the inner upper electrode 187A and the outer upper electrode 187B can be formed of other materials that are structurally, chemically, electrically, and mechanically compatible with the processes to be performed within the plasma processing region 182. The inner upper electrode 187A includes a number of throughports 197 defined as holes extending through an entire vertical thickness of the inner upper electrode 187A. The throughports 197 are distributed across the inner upper electrode 187A, relative to the x-y plane, to provide for flow of process gas(es) from a plenum region 188 above the upper electrode 187A/187B to the plasma processing region 182 below the upper electrode 187A/187B.

Figure 8A:
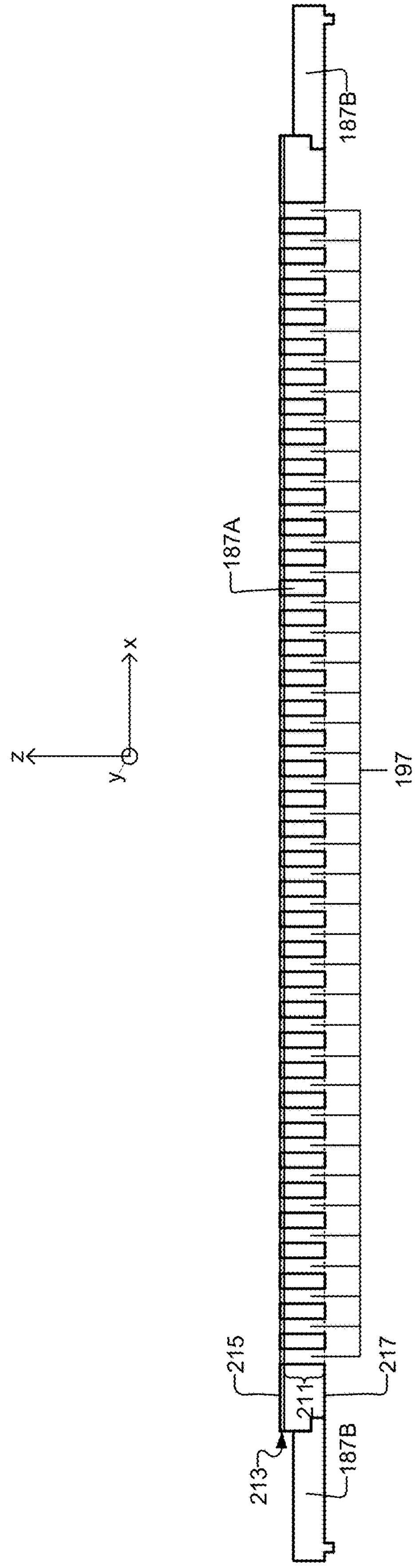
FIG. 8A shows a vertical cross-section view of the upper electrode, in accordance with some embodiments.

FIG. 8A shows a vertical cross-section view of the upper electrode 187A/187B, in accordance with some embodiments. In some embodiments, the inner upper electrode 187A includes a plate 211 formed of semiconducting material, such a single crystal silicon. In some embodiments, a high electrical conductivity layer 213 is formed on a top surface of the plate 211 and integral with the plate 211. The high electrical conductivity layer 213 has a lower electrical resistance than the semiconducting material of the plate 211. Each throughport 197 extends through an entire thickness of the inner upper electrode 187A from a top surface 215 of the inner upper electrode 187A to a bottom surface 217 of the inner upper electrode 187A. As previously stated, the inner upper electrode 187A is configured to physically separate the process gas plenum region 188 from the plasma processing region 182 and provide for flow of the process gas(es) through the distribution of throughport 197 from the process gas plenum region 188 to the plasma processing region 182.

Figure 8B:
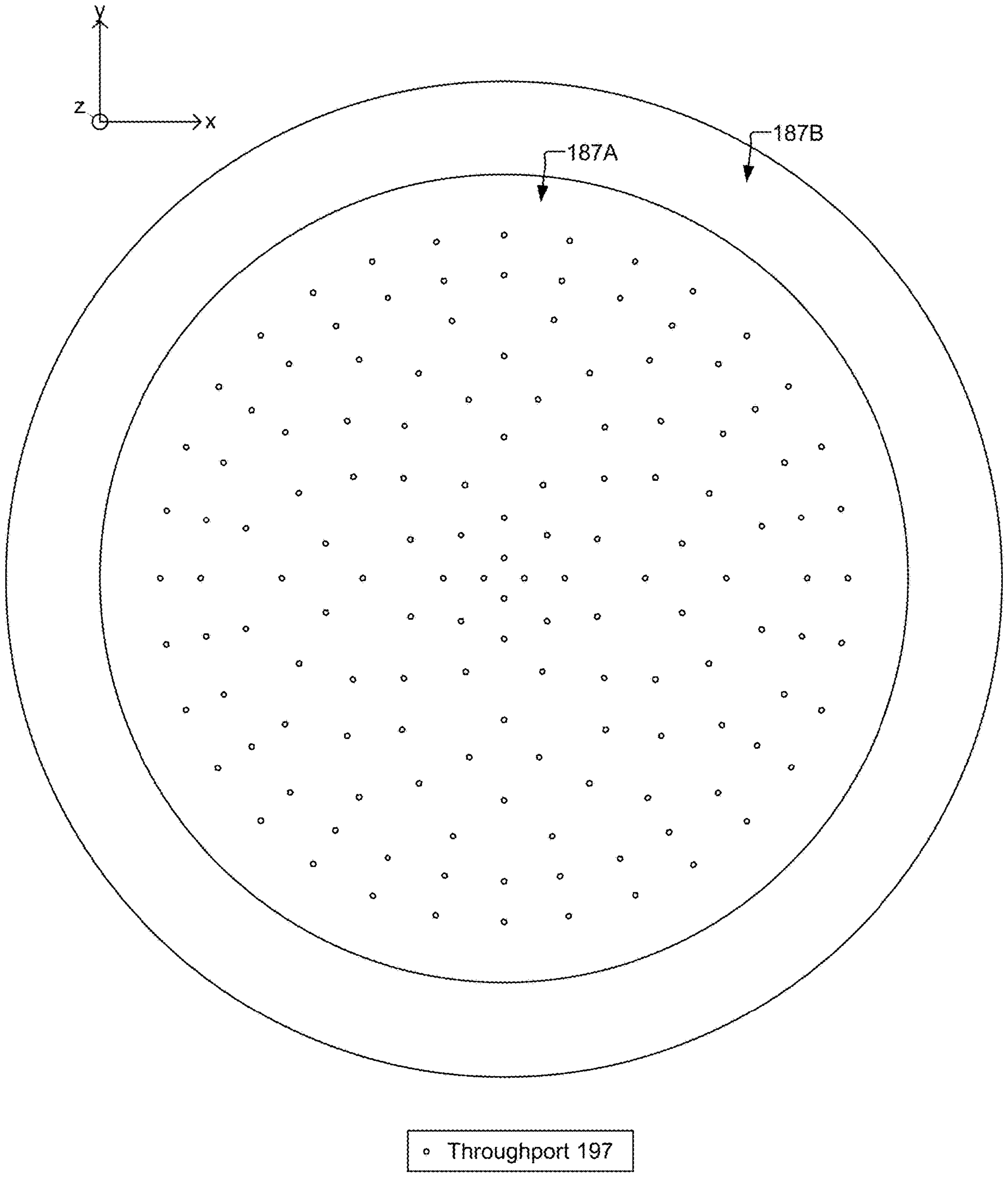
FIG. 8B shows a top view of the upper electrode, in accordance with some embodiments.

FIG. 8B shows a top view of the upper electrode 187A/187B, in accordance with some embodiments. FIG. 8B shows an example distribution of throughports 197 across the inner upper electrode 187A. It should be understood that the distribution of throughports 197 across the inner upper electrode 187A can be configured in different ways for different embodiments. For example, a total number of throughports 197 within the inner upper electrode 187A and/or a spatial distribution of throughports 197 within the inner upper electrode 187A can vary between different embodiments. Also, a diameter of the throughports 197 can vary between different embodiments. In general, it is of interest to reduce the diameter of the throughports 197 to a size small enough to prevent intrusion of the plasma 180 into the throughports 197 from the plasma processing region 182. In some embodiments, as the diameter of the throughports 197 is reduced, the total number of throughports 197 within the inner upper electrode 187A is increased to maintain a prescribed overall flowrate of process gas(es) from the process gas plenum region 188 through the inner upper electrode 187A to the plasma processing region 182. Also, in some embodiments, the upper electrode 187A/187B is electrically connected to a reference ground potential. However, in other embodiments, the inner upper electrode 187A and/or the outer upper electrode 187B is/are electrically connected to either a respective direct current (DC) electrical supply or a respective radiofrequency power supply by way of a corresponding impedance matching circuit.

With reference back to FIG. 1A, the plenum region 188 is defined by an upper member 189. One or more gas supply ports 192 are formed through the chamber 101 and the upper member 189 to be in fluid communication with the plenum region 188. The one or more gas supply ports 192 are fluidly connected (plumbed) to a process gas supply system 191. The process gas supply system 191 includes one or process gas supplies, one or more mass flow controller(s), one or more flow control valve(s), among other devices, to provide controlled flow of one or more process gas(es) through the one or more gas supply ports 192 to the plenum region 188, as indicated by arrow 193. In some embodiments, the process gas supply system 191 also includes one or more components for controlling a temperature of the process gas(es). The process gas supply system 191 is connected to the control system 120 through one or more signal conductors 194.

Figure 1B:
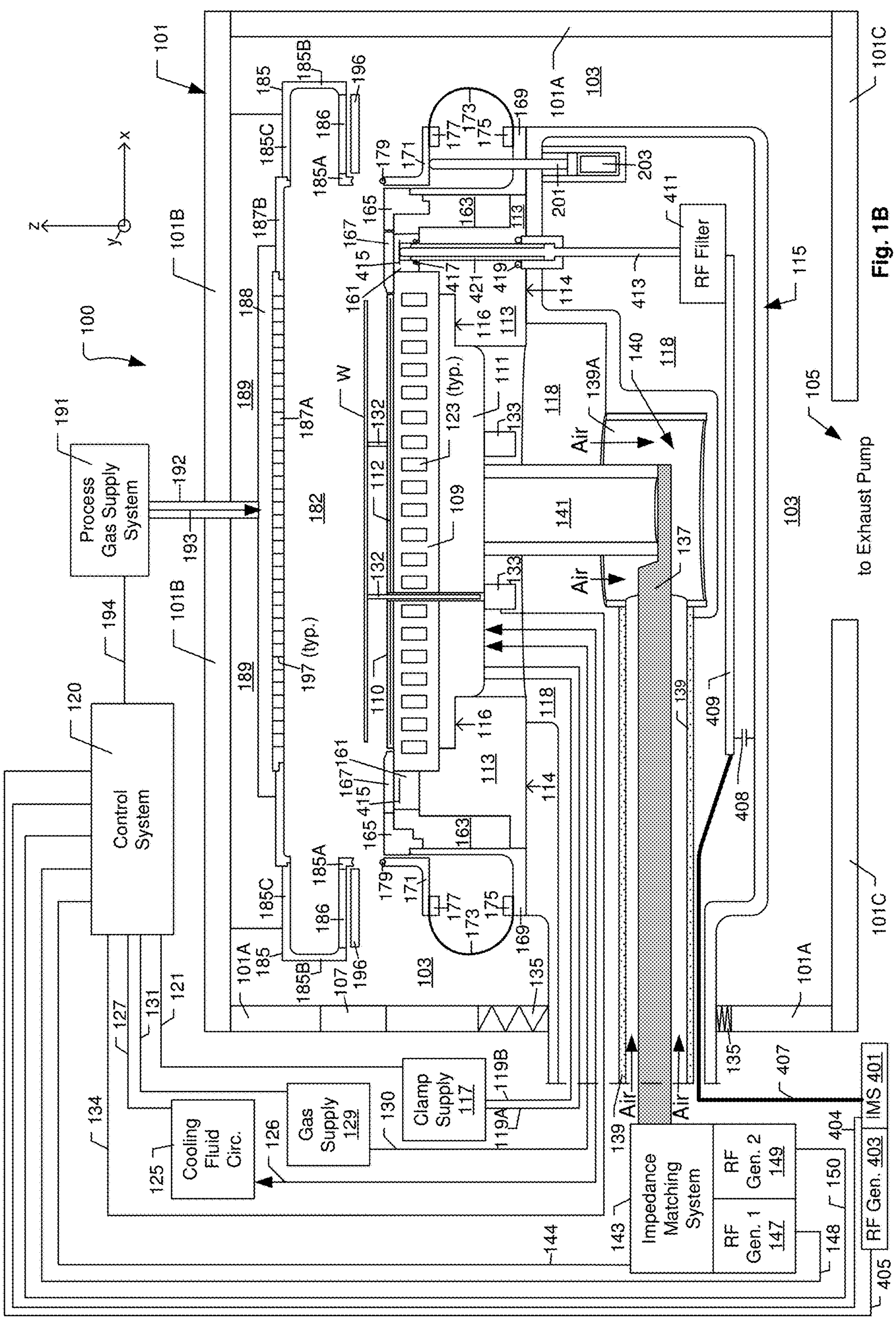
FIG. 1B shows the system of FIG. 1A with the cantilever arm assembly moved downward to enable movement of the wafer through the door, in accordance with some embodiments.

A processing gap (g1) is defined as the vertical (z-direction) distance as measured between the top surface of the ceramic layer 110 and the bottom surface of the inner upper electrode 187A. The size of the processing gap (g1) can be adjusted by moving the cantilever arm assembly 115 in the vertical direction (z-direction). As the cantilever arm assembly 115 moves upward, the articulating outer support flange 171 eventually engages the lower wall 185A of the C-shroud member 185, at which point the articulating outer support flange 171 moves along the fixed outer support flange 169 as the cantilever arm assembly 115 continues to move upward until the set of support rods 201 engage the articulating outer support flange 171 and the prescribed processing gap (g1) size is achieved. Then, to reverse this movement for removal of the wafer W from the chamber, the cantilever arm assembly 115 is moved downward until the articulating outer support flange 171 moves away from the lower wall 185A of the C-shroud member 185. FIG. 1B shows the system 100 of FIG. 1A with the cantilever arm assembly 115 moved downward to enable movement of the wafer W through the door 107, in accordance with some embodiments. In various embodiments, the size of the processing gap (g1) during plasma processing of the wafer W is controlled with a range up to about 10 centimeters, or within a range up to about 8 centimeters, or within a range up to about 5 centimeters. Also, in FIG. 1B, the wafer W is shown at a lifted position by way of the lift pins 133. It should be understood that FIG. 1A shows the system 100 in a closed configuration with the wafer W position on the ceramic layer 110 for plasma processing.

During plasma processing operations within the plasma processing system 100, the one or more process gas(es) are supplied to the plasma processing region 182 by way of the process gas supply system 191, plenum region 188, and throughports 197 within the inner upper electrode 187A. Also, radiofrequency signals are transmitted into the plasma processing region 182, by way of the first and second radiofrequency signal generators 147, 149, the impedance matching system 143, the radiofrequency signal supply rod 137, the radiofrequency signal supply shaft 141, the facilities plate 111, the electrode 109, and through the ceramic layer 110. The radiofrequency signals transform the process gas(es) into the plasma 180 within the plasma processing region 182. Ions and/or reactive constituents of the plasma interact with one or more materials on the wafer W to cause a change in composition and/or shape of particular material(s) present on the wafer W. The exhaust gases from the plasma processing region 182 flow through the vents 186 in the C-shroud member 185 and through the interior region 103 within the chamber 101 to the exhaust port 105 under the influence of a suction force applied at the exhaust port 105, as indicated by arrows 195.

In various embodiments, the electrode 109 can be configured to have different diameters. However, in some embodiments, to increase the surface of the electrode 109 upon which the edge ring 167 rests, the diameter of the electrode 109 is extended. In some embodiments, an electrically conductive gel 226 is disposed between a bottom of the edge ring 167 and the top of the electrode 109 and/or between the bottom of the edge ring 167 and the top of the coupling ring 161. In these embodiments, the increased diameter of the electrode 109 provides more surface area upon which the conductive gel is disposed between the edge ring 167 and the electrode 109.

It should be understood that the combination of the articulating outer support flange 171, the electrically conductive straps 173, and the fixed outer support flange 169 are electrically at a reference ground potential, and collectively form a ground return path for radiofrequency signals transmitted from the electrode 109 through the ceramic layer 110 into the plasma processing region 182. The azimuthal uniformity of this ground return path around the perimeter of the electrode 109 can have an effect on uniformity of process results on the wafer W. For example, in some embodiments, the uniformity of etch rate across the wafer W can be affected by the azimuthal uniformity of the ground return path around the perimeter of the electrode 109. To this end, it should be understood that the number, configuration, and arrangement of the electrically conductive straps 173 around the perimeter of the electrode 109 can affect the uniformity of process results across the wafer W.

With reference back to FIG. 1A, a Tunable Edge Sheath (TES) system is implemented to include a TES electrode 415 disposed (embedded) within the coupling ring 161. The TES system also includes a number of TES radiofrequency signal supply pins 413 in physical and electrical connection with the TES electrode 415. Each TES radiofrequency signal supply pin 413 extends through a corresponding insulator feedthrough member 421 configured to electrically separate the TES radiofrequency signal supply pin 413 from surrounding structures, such as from the ceramic support 113 and the cantilever arm assembly 115 structure. In some embodiments, o-rings 417 and 419 are disposed to ensure that the region inside of the insulator feedthrough member 421 is not exposed to any materials/gases present within the plasma processing region 182. In some embodiments, the TES radiofrequency signal supply pins 413 are formed of copper, or aluminum, or anodized aluminum, among others.

The TES radiofrequency signal supply pins 413 extend into the open region 118 inside of the cantilever arm assembly 115, where each of the TES radiofrequency signal supply pins 413 is electrically connected to a TES radiofrequency signal supply conductor 409 through a corresponding TES radiofrequency signal filter 411. In some embodiments, three TES radiofrequency signal supply pins 413 are positioned to physically and electrically connect with the TES electrode 415 at substantially equally spaced azimuthal locations about the centerline of the electrode 109. It should be understood, however, that other embodiments can have more than three TES radiofrequency signal supply pins 413 in physical and electrical connection with the TES electrode 415. Also, some embodiments can have either one or two TES radiofrequency signal supply pins 413 in physical and electrical connection with the TES electrode 415. Each TES radiofrequency signal supply pin 413 is electrically connected to a corresponding TES radiofrequency signal filter 411, with each TES radiofrequency signal filter 411 electrically connected to the TES radiofrequency signal supply conductor 409. In some embodiments, each TES radiofrequency signal filter 411 is configured as an inductor. For example, in some embodiments, each TES radiofrequency signal filter 411 is configured as a coiled conductor, such as a metal coil wrapped around a dielectric core structure. In various embodiments, the metal coil can be formed of solid copper rod, copper tubing, aluminum rod, or aluminum tubing, among others. Also, in some embodiments, each TES radiofrequency signal filter 411 can be configured as a combination of inductive and capacitive structures. In the interest of improving plasma processing result uniformity across the wafer W, each of the TES radiofrequency signal filters 411 has a substantially same configuration.

In some embodiments, the TES radiofrequency signal supply conductor 409 is formed as a ring-shaped (annular-shaped) structure, so as to extend around the open region 118 inside of the cantilever arm assembly 115 to enable physical and electrical connection of the azimuthally distributed TES radiofrequency signal filters 411 with the TES radiofrequency signal supply conductor 409. In some embodiments, the TES radiofrequency signal supply conductor 409 is formed as a solid (non-tubular) structure. Alternatively, in some embodiments, the TES radiofrequency signal supply conductor 409 is formed as a tubular structure. In some embodiments, the TES radiofrequency signal supply conductor 409 is formed of copper, or aluminum, or anodized aluminum, among others.

The TES radiofrequency signal supply conductor 409 is electrically connected to a TES radiofrequency supply cable 407. Also, a capacitor 408 is connected between the TES radiofrequency signal supply conductor 409 and a reference ground potential, such as the structure of the cantilever arm assembly 115. More specifically, the capacitor 408 has a first terminal electrically connected to both the TES radiofrequency supply cable 407 and the TES radiofrequency signal supply conductor 409, and the capacitor 408 has a second terminal electrically connected to the reference ground potential. In some embodiments, the capacitor 408 is a variable capacitor. In some embodiments, the capacitor 408 is a fixed capacitor. In some embodiments, the capacitor 408 is set to have a capacitance within a range extending from about 10 picoFarads to about 100 picoFarads. The TES radiofrequency supply cable 407 is connected to a TES impedance matching system 401. The TES impedance matching system 401 is connected to a TES radiofrequency signal generator 403. Radiofrequency signals generated by the TES radiofrequency signal generator 403 are transmitted through the TES impedance matching system 401 to the TES radiofrequency supply cable 407, then to the TES radiofrequency signal supply conductor 409, then through the TES radiofrequency signal filters 411 to the respective TES radiofrequency signal supply pins 413, and to the TES electrode 415 within the coupling ring 161. In some embodiments, the TES radiofrequency signal generator 403 is configured and operated to generate radiofrequency signals within a frequency range extending from about 50 kiloHertz to about 27 MHz. In some embodiments, the TES radiofrequency signal generator 403 supplies radiofrequency power within a range extending from about 50 Watts to about 10 kiloWatts. The TES radiofrequency signal generator 403 is also connected to the control system 120 through one or more signal conductors 405.

Figure 3B:
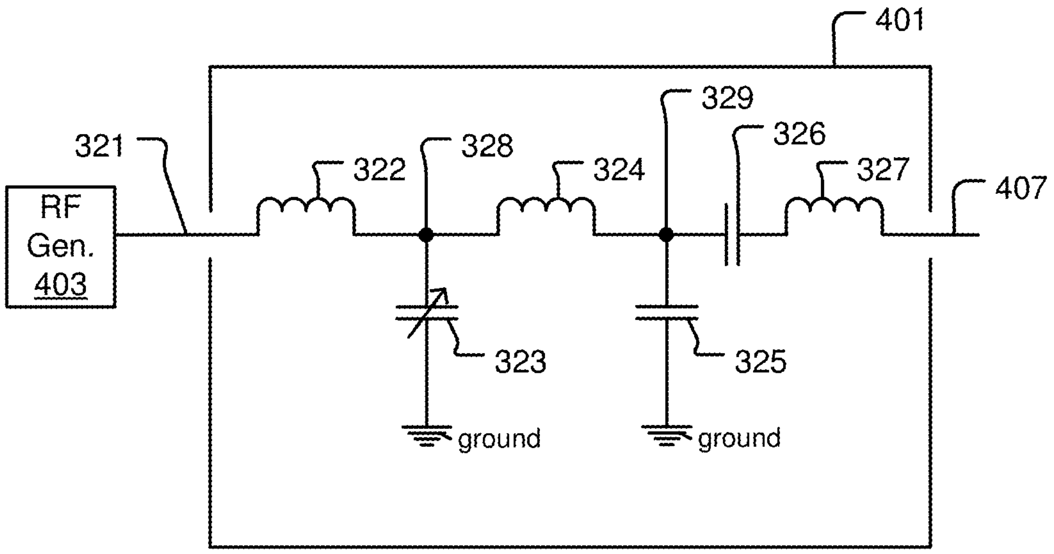
FIG. 3B shows an example electrical schematic of the TES impedance matching system, in accordance with some embodiments.

The TES impedance matching system 401 includes an arrangement of inductors and capacitors sized and connected to provide for impedance matching so that radiofrequency power can be transmitted from the TES radiofrequency signal generator 403 along the TES radiofrequency supply cable 407, along the TES radiofrequency signal supply conductor 409, through the TES radiofrequency signal filters 411, through the respective TES radiofrequency signal supply pins 413, to the TES electrode 415 within the coupling ring 161, and into the plasma processing region 182 above the edge ring 167. FIG. 3B shows an example electrical schematic of the TES impedance matching system 401, in accordance with some embodiments. The TES impedance matching system 401 includes an input line 321 electrically connected to the TES radiofrequency signal generator 403. The TES input line 321 is electrically connected to an input terminal of a first inductor 322. An output terminal of the first inductor 322 is electrically connected to an internal node 328. A second inductor 324 has an input terminal electrically connected to the internal node 328. An output terminal of the second inductor 324 is electrically connected to a second internal node 329. A first capacitor 326 has an input terminal electrically connected to the second internal node 329. An output terminal of the first capacitor 326 is electrically connected to an input terminal of a third inductor 327. An output terminal of the third inductor 327 is electrically connected to the TES radiofrequency supply cable 407. Also, a second capacitor 323 has an input terminal electrically connected to the first internal node 328. The second capacitor 323 has an output terminal electrically connected to a reference ground potential. In some embodiments, the second capacitor 323 is a variable capacitor. Also, a third capacitor 325 has an input terminal electrically connected to the second internal node 329. The third capacitor 325 has an output terminal electrically connected to a reference ground potential. It should be understood that the electrical configuration of the TES impedance matching system 401 as shown in FIG. 3B is provided by way of example. In other embodiments, the TES impedance matching system 401 can have a configuration of inductors and/or capacitors that is different from the example shown in FIG. 3B. The TES impedance matching system 401 is also connected to the control system 120 through one or more signal conductors 404.

By transmitting radiofrequency signals/power through the TES electrode 415 disposed (embedded) within the coupling ring 161, the TES system is capable of controlling characteristics of the plasma 180 near the peripheral edge of the wafer W. For example, in some embodiments, the TES system is operated to control the plasma 180 sheath properties near the edge ring 167, such as by controlling a shape of the plasma 180 sheath and/or by controlling a size (either increase in sheath thickness or decrease in sheath thickness). Also, in some embodiments, by controlling the shape of the plasma 180 sheath near the edge ring 167, it is possible to control various properties of the bulk plasma 180 over the wafer W. Also, in some embodiments, the TES system is operated to control a density of the plasma 180 near the edge ring 167. For example, in some embodiments, the TES system is operated to either increase or decrease the density of the plasma 180 near the edge ring 167. Also, in some embodiments, the TES system is operated to control a bias voltage present on the edge ring 167, which in turn controls/influences movement of ions and other charged constituents within the plasma 180 near the edge ring 167. For example, in some embodiments, the TES system is operated to control a bias voltage present on the edge ring 167 to attract more ions from the plasma 180 toward the edge of the wafer W. And, in some embodiments, the TES system is operated to control a bias voltage present on the edge ring 167 to repel ions from the plasma 180 away from the edge of the wafer W. It should be understood that the TES system can be operated to perform a variety of different functions, such as those mentioned above, among others, either separately or in combination.

Figure 9A:
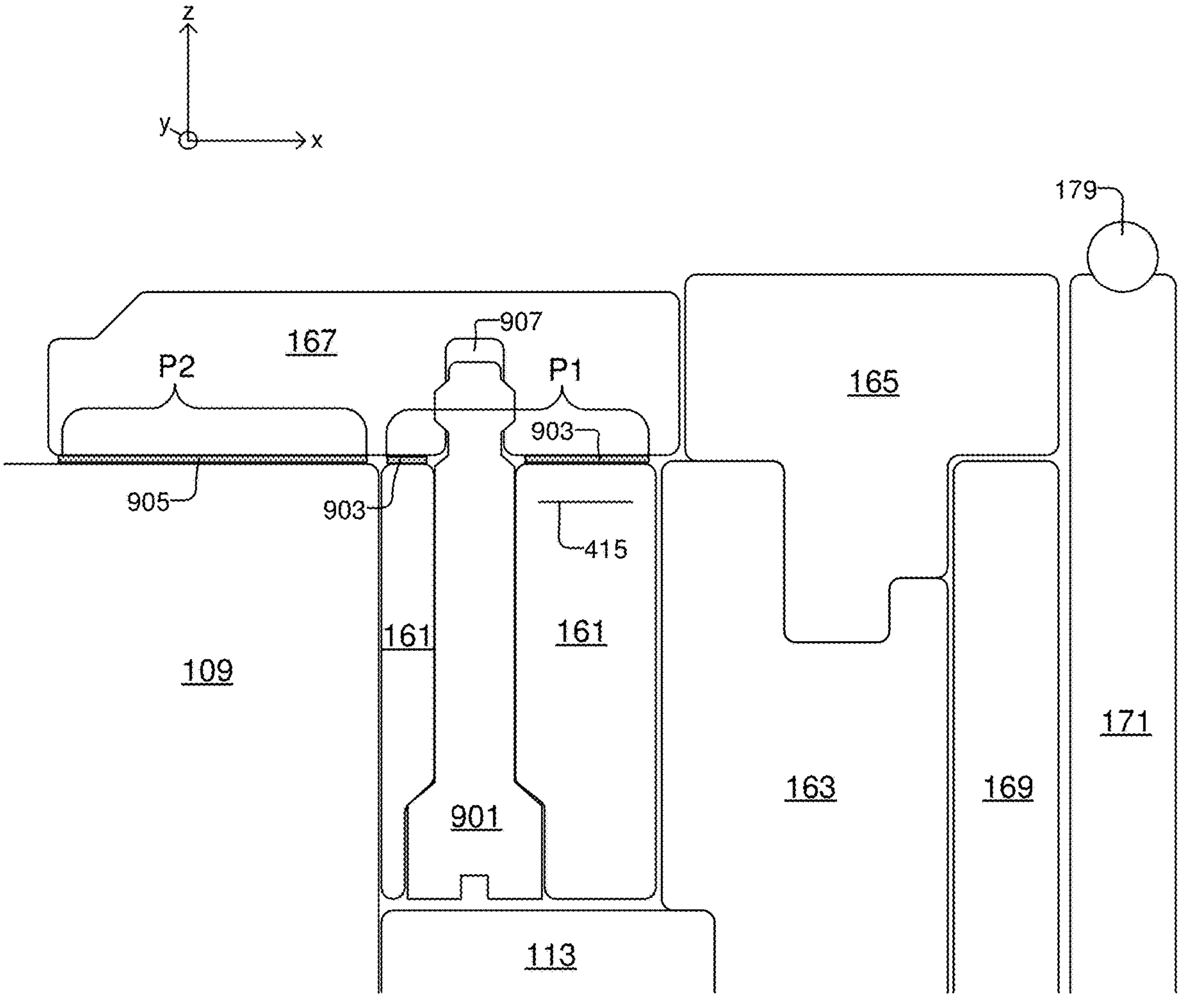
FIG. 9A shows a close-up vertical cross-section view of the connection between the coupling ring and the edge ring, in accordance with some embodiments.

FIG. 9A shows a close-up vertical cross-section view of the connection between the coupling ring 161 and the edge ring 167, in accordance with some embodiments. In some embodiments, the coupling ring 161 is formed of a dielectric material, such as quartz, or ceramic, or alumina ($Al_2O_3$), or a polymer, among others.

A bottom surface of the edge ring 167 has a portion P1 that is coupled to the upper surface of the coupling ring 161 through a layer of thermally and electrically conductive gel 903 to thermally sink the coupling ring 161 to the edge ring 167. Also, the bottom surface of the edge ring 167 has another portion P2 that is coupled to an upper surface of the electrode 109 through a layer of thermally and electrically conductive gel 905. Examples of the thermally and electrically conductive gel 903, 905 include polyimide, polyketone, polyetherketone, polyether sulfone, polyethylene terephthalate, fluoroethylene propylene copolymers, cellulose, triacetates, and silicone, among others. In some embodiments, the thermally and electrically conductive gel 903, 905 is formed as a double-sided tape. In some embodiments, the edge ring 167 has an inner diameter sized to be proximate to the outer diameter of the ceramic layer 110.

The edge ring 167 is secured to the coupling ring 161 by a number of fasteners 901 azimuthally distributed around the edge ring 167. In some embodiments, threaded holes are formed within the edge ring 167 to respectively receive the fasteners 901. In some embodiments, threaded inserts are disposed within the edge ring 167 to respectively receive the fasteners 901. For example, a threaded insert can be configured as a tubular sleeve having a threaded inner wall surface for receiving threads of the fasteners 901, and with the tubular sleeve of the threaded insert having an outer wall surface secured (mechanically and/or chemically) to a corresponding hole formed within the edge ring 167. Also, holes are formed through the coupling ring 161 to enable insertion of the fasteners 901. In some embodiments, the fasteners 901 are formed of metal, such as steel, aluminum, an alloy of steel, or an alloy of aluminum, among others. Alternatively, in some embodiments, the fasteners 901 are formed of plastic. In some embodiments, the holes formed within the coupling ring 161 through which the fasteners 901 are disposed are formed to closely accommodate the size of the fasteners 901. In some embodiments, the holes formed within the edge ring 167 to receive the fasteners 901 are drilled deep enough that a vertical space 907 (as measured in the z-direction) exists between the end of the fastener 901 and the overlying portion of the edge ring 167, when the fastener 901 is fully seated within the hole. The vertical space 907 is sized to prevent electrical arcing within the space 907. Also, in some embodiments, the head of the fastener 901 is countersunk within the coupling ring 161.

In various embodiments, the TES electrode 415 is formed of an electrically conductive material, such as platinum, steel, aluminum, or copper, among others. During operation, capacitive coupling occurs between the TES electrode 415 and the edge ring 167, such that the edge ring 167 is electrically powered to influence processing of the wafer W near the outer perimeter of the wafer W.

Figure 9B:
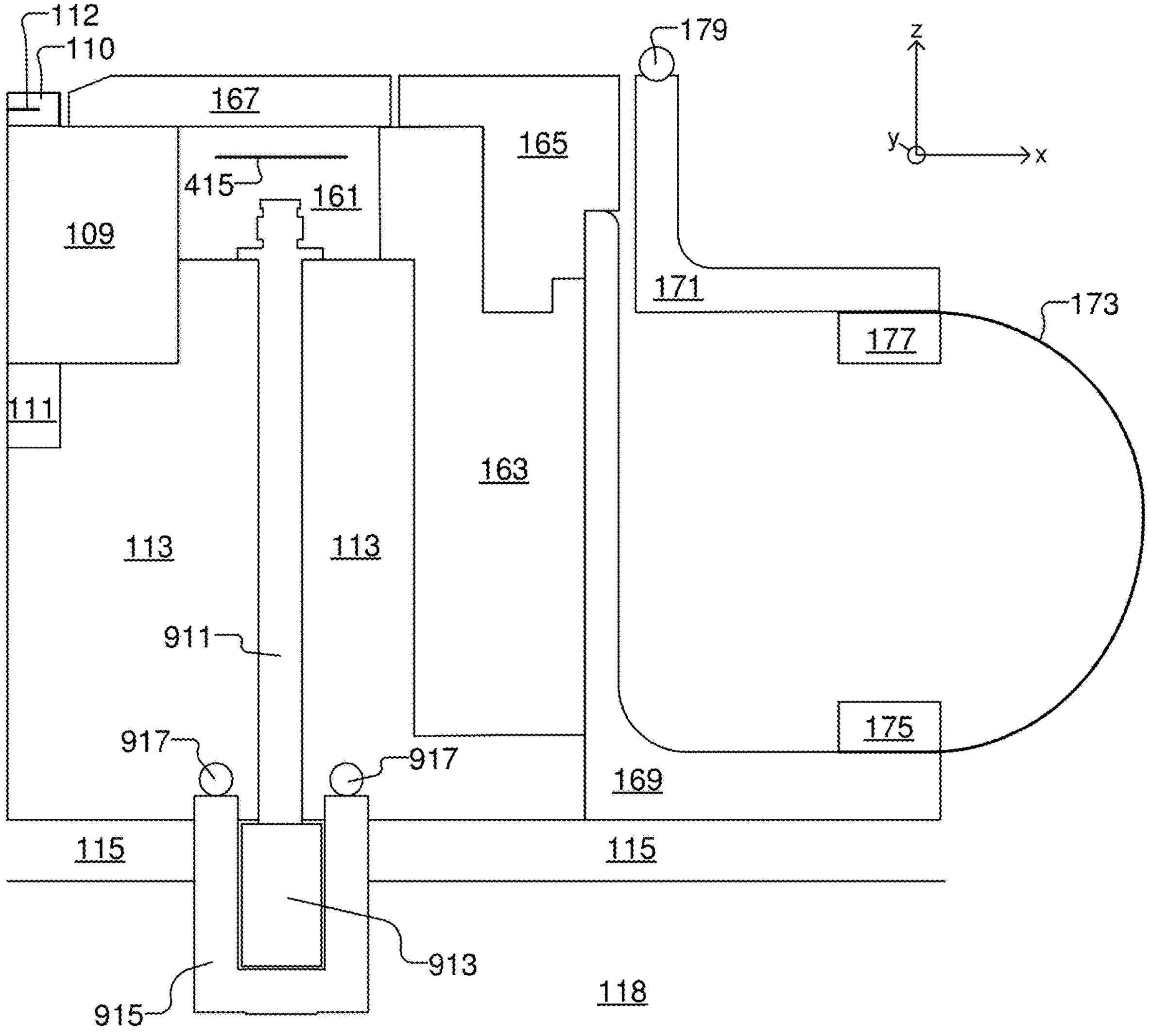
FIG. 9B shows a close-up vertical cross-section view of the hold-down rod connected to the coupling ring, in accordance with some embodiments.

In some embodiments, a number of hold-down rods 911 are used to secure the coupling ring 161 to the ceramic support 113. FIG. 9B shows a close-up vertical cross-section view of the hold-down rod 911 connected to the coupling ring 161, in accordance with some embodiments. The hold-down rod 911 extends through a hole formed within the ceramic support 113 and is secured within a receptacle formed within the coupling ring 161. In some embodiments, the receptacle formed within the coupling ring 161 for the hold-down rod 911 has a threaded wall formed to engage with threads present at the end of the hold-down rod 911. In some embodiments, a threaded insert is disposed within the coupling ring 161 to receive a correspondingly threaded end portion of the hold-down rod 911. The hold-down rod 911 is secured to a hold-down control mechanism 913 disposed within a mounting structure 915 inside of the open region 118 within the cantilever arm assembly 115. The mounting structure 915 is secured to the cantilever arm assembly 115. In some embodiments, an o-ring 917 is disposed between the mounting structure 915 and the ceramic support 113 to ensure that the atmospheric environment within the open region 118 within the cantilever arm assembly 115 is kept isolated from the plasma processing region 182, and vice-versa.

In some embodiments, the hold-down control mechanism 913 is configured and operated to pull the coupling ring 161 downward toward the ceramic support 113 to ensure that any seals (o-rings) that are disposed between the coupling ring 161 and the ceramic support and/or between the edge ring 167 and coupling ring 161 are fully engaged. In some embodiments, the hold-down control mechanism 913 uses pneumatic pressure to pull the coupling ring 161 downward toward the ceramic support 113. In other embodiments, the hold-down control mechanism 913 uses electromechanically generated and applied force to pull the coupling ring 161 downward toward the ceramic support 113. In some embodiments, three hold-down rods 911 are connected to the coupling ring 161 at substantially equally spaced azimuthal locations around the coupling ring 161. However, in other embodiments, more than three hold-down rods 911 are connected to the coupling ring 161. Also, in various embodiments, the multiple hold-down rods 911 that are connected to the coupling ring 161 are azimuthally positioned around the coupling ring 161 either in a substantially equal spaced manner or in a non-equally spaced manner In some embodiments, the hold-down rods 911 are formed of a rigid material that is not electrically conductive, such as plastic among other materials.

Figure 9C:
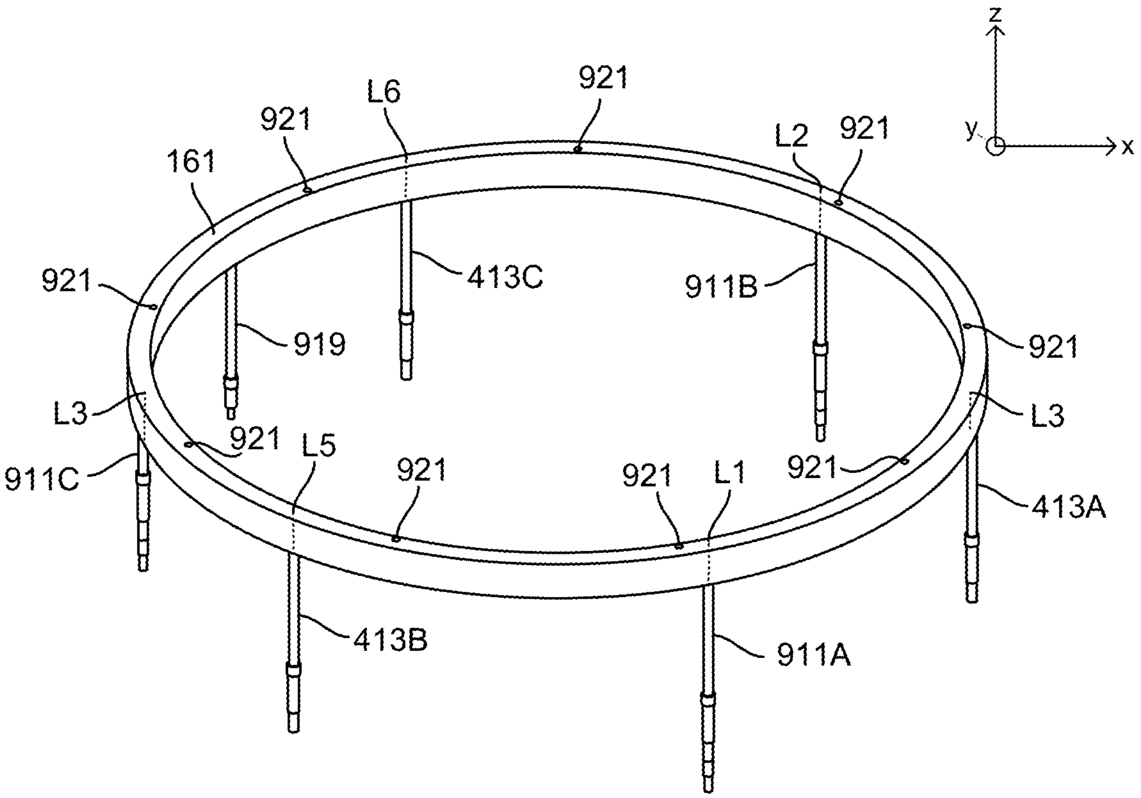
FIG. 9C shows an perspective top view of the coupling ring, in accordance with some embodiments.

FIG. 9C shows a perspective top view of the coupling ring 161, in accordance with some embodiments. In the example embodiment of FIG. 9C, three hold-down rods 911A, 911B, and 911C are connected to the coupling ring 161 at locations L1, L2, and L3, respectively. In some embodiments, the locations L1, L2, and L3 are vertices of an equilateral triangle coplanar with the bottom surface of the coupling ring 161. Also, the example embodiment of FIG. 9C shows three TES radiofrequency signal supply pins 413A, 413B, and 413C connected to the coupling ring 161 at locations L4, L5, and L6, respectively. In some embodiments, the locations L4, L5, and L6 are vertices of an equilateral triangle coplanar with the bottom surface of the coupling ring 161. Also, the example embodiment of FIG. 9C shows a temperature probe feedthrough sleeve 919 connected to the bottom surface of the coupling ring 161. The temperature probe feedthrough sleeve 919 extends through a hole formed within the ceramic support 113 and provides a channel through which a temperature probe is inserted for measuring a temperature of the coupling ring 161 and/or edge ring 167. The example embodiment of FIG. 9C also shows a number of holes 921 formed through the coupling ring 161 through which the fasteners 901 are positioned to secure the coupling ring 161 to the edge ring 167.

Figure 10A:
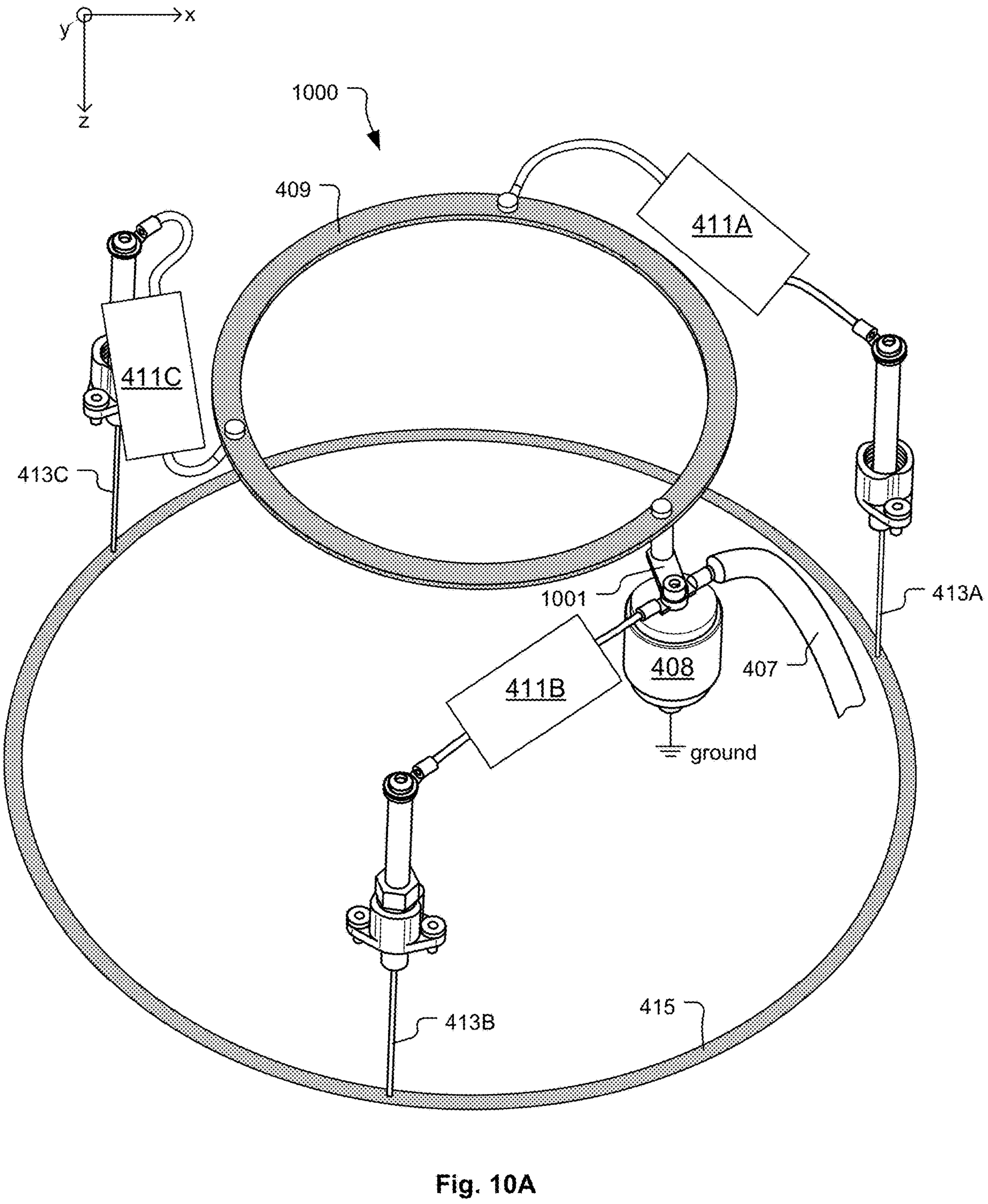
FIG. 10A shows a perspective bottom view of a portion of a TES system that is disposed inside of the cantilevered arm assembly, in accordance with some embodiments.

FIG. 10A shows a perspective bottom view of a portion of a TES system 1000 that is disposed inside of the cantilevered arm assembly 115, in accordance with some embodiments. The TES radiofrequency supply cable 407 is electrically connected to the capacitor 408. The TES radiofrequency supply cable 407 is also electrically connected to the TES radiofrequency signal supply conductor 409 by way of a conductive strap 1001. A TES radiofrequency signal filter 411A has an input terminal electrically connected to the TES radiofrequency signal supply conductor 409. The TES radiofrequency signal filter 411A has an output terminal electrically connected to the TES radiofrequency signal supply pin 413A. Also, a TES radiofrequency signal filter 411B has an input terminal electrically connected to the TES radiofrequency signal supply conductor 409 by way of the conductive strap 1001. The TES radiofrequency signal filter 411B has an output terminal electrically connected to the TES radiofrequency signal supply pin 413B. A TES radiofrequency signal filter 411C has an input terminal electrically connected to the TES radiofrequency signal supply conductor 409. The TES radiofrequency signal filter 411C has an output terminal electrically connected to the TES radiofrequency signal supply pin 413C. It should be understood that each of the TES radiofrequency signal supply pins 413A, 413B, and 413C is electrically connected to the TES radiofrequency signal supply conductor 409 through a corresponding TES radiofrequency signal filter 411A, 411B, and 411C, respectively. In this manner, each TES radiofrequency signal supply pin 413A, 413B, and 413C has a corresponding TES radiofrequency signal filter 411A, 411B, and 411C, respectively, for blocking high frequency radiofrequency signals, e.g., 60 MHz signals, that attempt to couple through the TES radiofrequency signal supply pins 413A, 413B, and 413C to the TES system 1000.

Figure 10B:
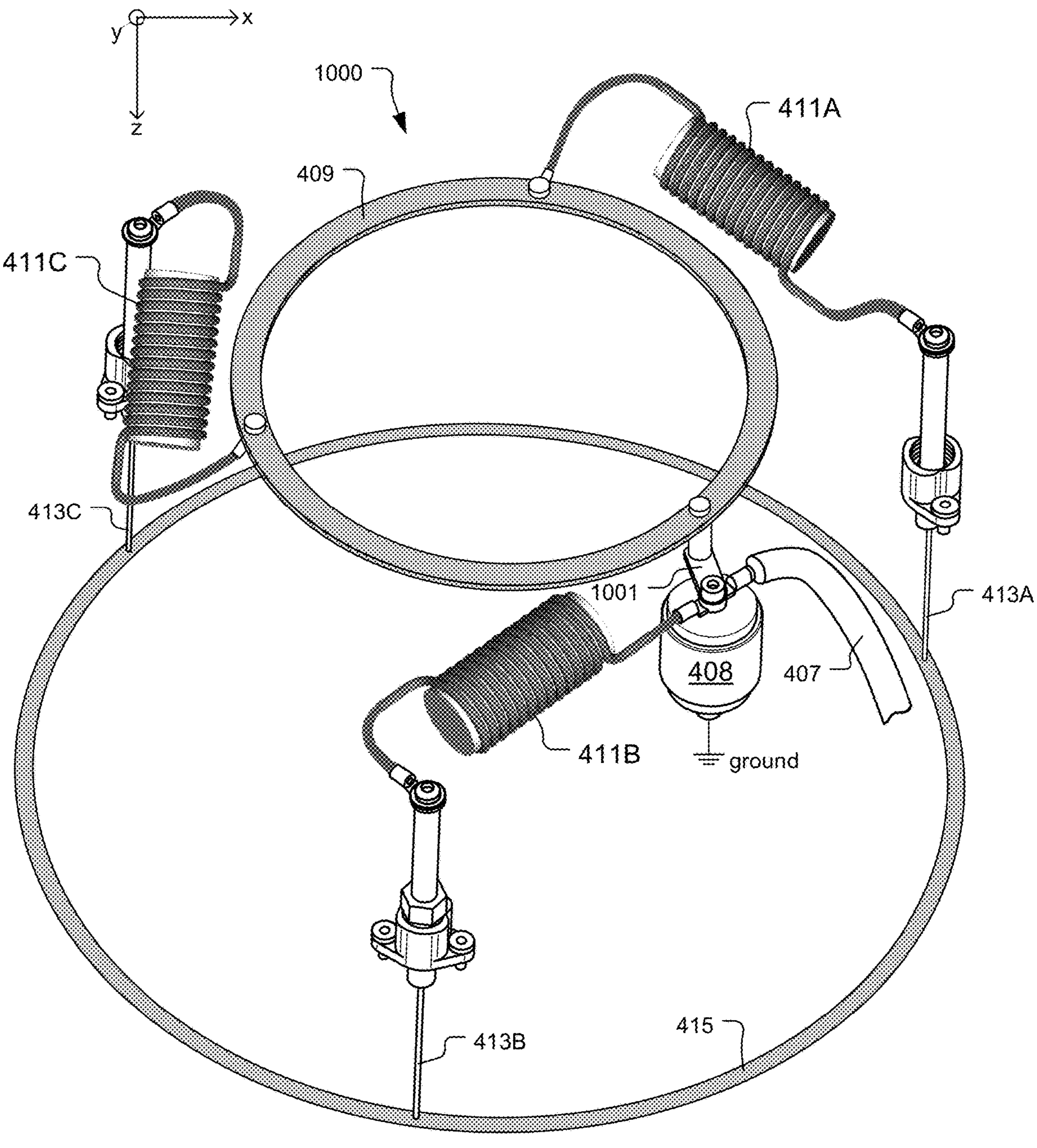
FIG. 10B shows the perspective bottom view of the TES system as shown in FIG. 10A, with the TES radiofrequency signal filters configured as respective conductive coils, in accordance with some embodiments.

FIG. 10B shows the perspective bottom view of the TES system 1000 as shown in FIG. 10A, with the TES radiofrequency signal filters 411A, 411B, and 411C configured as respective conductive coils, in accordance with some embodiments. In some embodiments, a substantially similarly configured conductive coil is used for each of the TES radiofrequency signal filters 411A, 411B, and 411C. In some embodiments, each of the conductive coils that form the TES radiofrequency signal filters 411A, 411B, and 411C has a substantially same inductance value. In some embodiments, the inductance value of each of the conductive coils that form the TES radiofrequency signal filters 411A, 411B, and 411C is within a range extending from about 1 microHenry to about 5 microHenry. It should be understood that each of the TES radiofrequency signal supply pins 413A, 413B, and 413C is directly electrically connected to a corresponding one of the TES radiofrequency signal filters 411A, 411B, and 411C, respectively. In some embodiments, there is no other electrical component connected between each of the TES radiofrequency signal supply pins 413A, 413B, and 413C and its corresponding TES radiofrequency signal filters 411A, 411B, and 411C, respectively. Also, it should be understood that each of the TES radiofrequency signal supply pins 413A, 413B, and 413C is not directly connected to either the TES radiofrequency supply cable 407 or the TES radiofrequency signal supply conductor 409, but rather is electrically connected through its corresponding TES radiofrequency signal filters 411A, 411B, and 411C, respectively, to the TES radiofrequency supply cable 407 and/or the TES radiofrequency signal supply conductor 409. In this manner, high frequency radiofrequency signals (e.g., 60 MHz signals) that reach the TES radiofrequency signal supply pins 413A, 413B, and 413C from within the plasma processing region 182 are substantially blocked by the TES radiofrequency signal filters 411A, 411B, and 411C, respectively, and are thereby prevented from reaching either the TES radiofrequency supply cable 407 or the TES radiofrequency signal supply conductor 409.

Figure 11:
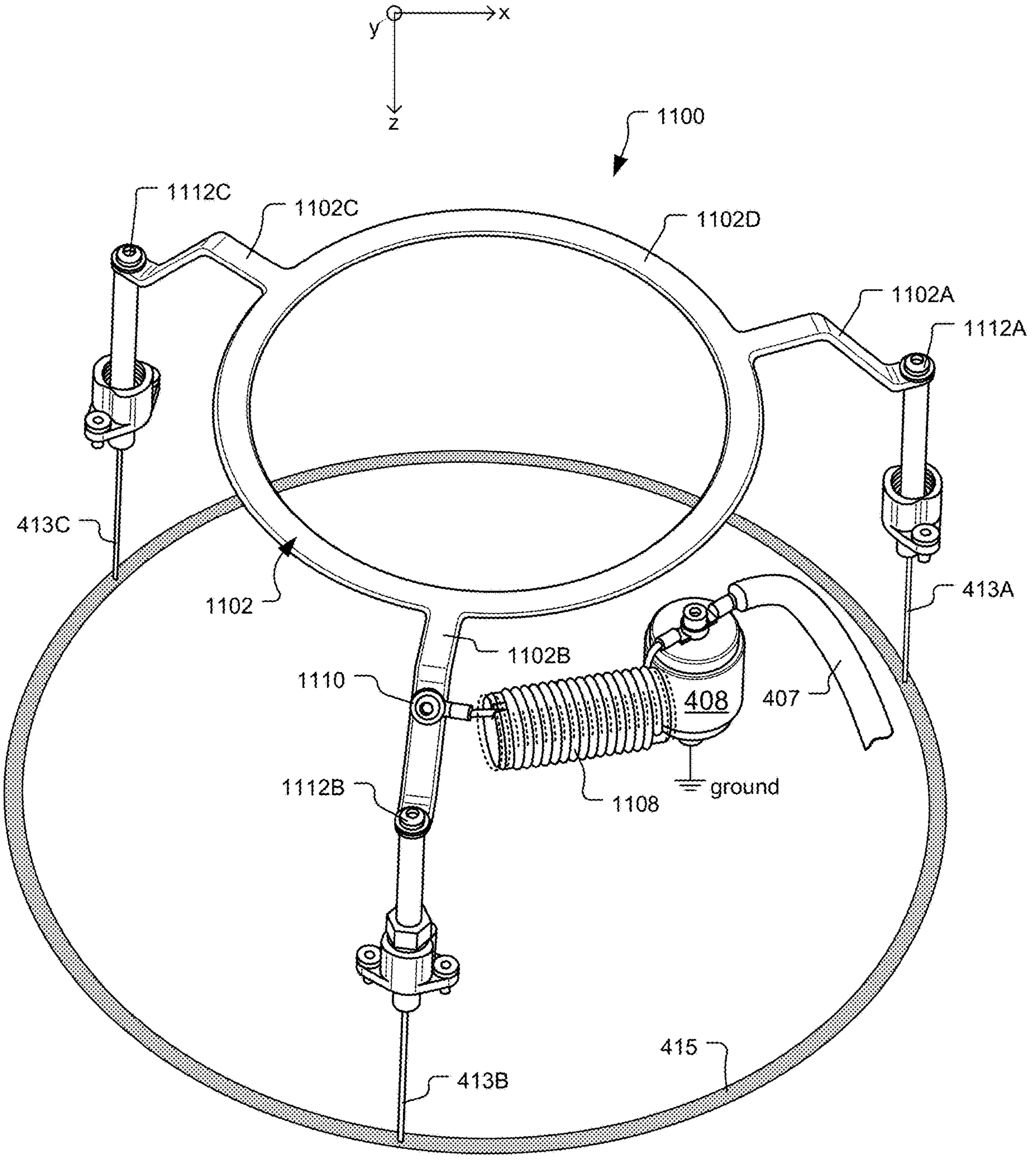
FIG. 11 shows a perspective bottom view of an alternative TES system that uses a single TES radiofrequency signal filter for all TES radiofrequency signal supply pins, in accordance with some embodiments.

FIG. 11 shows a perspective bottom view of an alternative TES system 1100 that uses a single TES radiofrequency signal filter 1108 for all TES radiofrequency signal supply pins 413A, 413B, and 413C, in accordance with some embodiments. The alternative TES system 1100 has the TES radiofrequency supply cable 407 electrically connected to the first terminal the capacitor 408. Also, first terminal of the single TES radiofrequency signal filter 1108 is electrically connected to the first terminal of the capacitor 408. The capacitor 408 also has a second terminal electrically connected to the reference ground potential. A second terminal of the single TES radiofrequency signal filter 1108 is electrically connected to a TES spider structure 1102 at a location 1110. The TES spider structure 1102 includes a ring portion 1102D and three leg portions 1102A, 1102B, and 1102C extending from the ring portion 1102D to the locations of the TES radiofrequency signal supply pins 413A, 413B, and 413C, respectively. Each of the three leg portions 1102A, 1102B, and 1102C of the TES spider structure 1102 is electrically connected to a corresponding one of the TES radiofrequency signal supply pins 413A, 413B, and 413C, respectively, as shown at locations 1112A, 1112B, and 1112C, respectively. The TES spider structure 1102 is formed of an electrically conductive material, such as aluminum, stainless steel, an alloy of aluminum, an alloy of steel, or copper, among others.

In contrast to the TES system 1000 of FIGS. 1A, 1B, 3B, 9A, 9B, 9C, 10A, and 10B, the alternative TES system 1100 of FIG. 11 has the TES radiofrequency signal supply pins 413A, 413B, and 413C directly electrically connected to the TES spider structure 1102 rather than being directly and exclusively electrically connected to a corresponding TES radiofrequency signal filters 411A, 411B, and 411C, respectively. Therefore, in the alternative TES system 1100 of FIG. 11, high frequency signals (e.g., 60 MHz signals) that reach the TES radiofrequency signal supply pins 413A, 413B, and 413C from within the plasma processing region 182 are able to circulate within/around the TES spider structure 1102 without being blocked by the single TES radiofrequency signal filter 1108. However, the single TES radiofrequency signal filter 1108 is effective at preventing the high frequency signals from reaching the TES radiofrequency supply cable 407. In some embodiments, the uniformity of plasma processing results across the wafer W can be adversely influenced/affected by the high frequency signals that couple into the TES radiofrequency signal supply pins 413A, 413B, and 413C and circulate within/around the TES spider structure 1102.

Figure 12A:
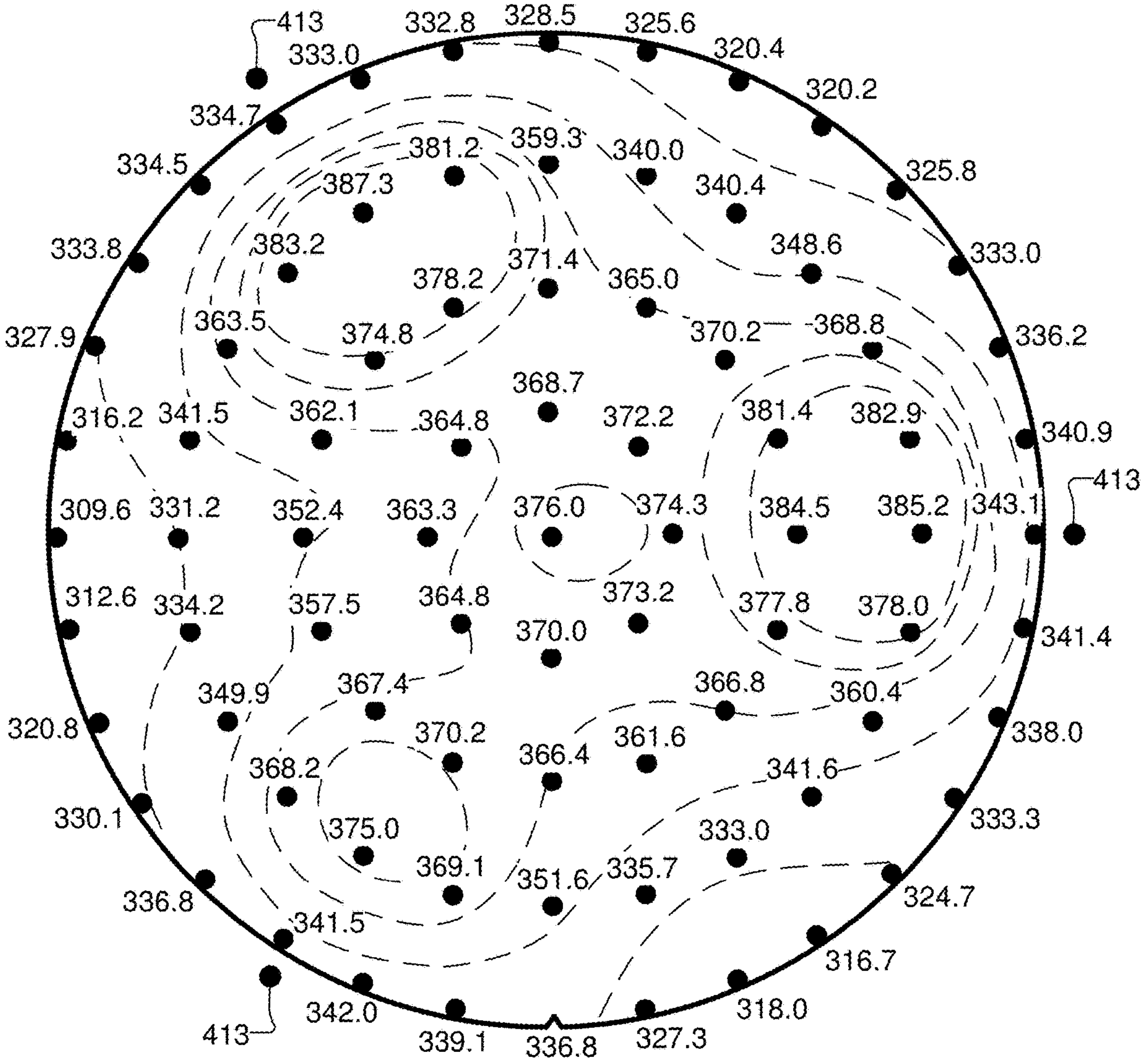
FIG. 12A shows a wafer map of plasma processing results across the wafer obtained using the TES system of FIG. 11, in accordance with some embodiments.

The TES system 1000 described with regard to FIGS. 1A, 1B, 3B, 9A, 9B, 9C, 10A, and 10B provides better azimuthal uniformity of plasma processing results across the wafer W as compared with the TES system 1100 described with regard to FIG. 11. For example, FIG. 12A shows a wafer map of plasma processing results across the wafer W obtained using the TES system 1100 of FIG. 11, in accordance with some embodiments. The plasma processing results of FIG. 12A were obtained by performing a prescribed etching plasma process on a test wafer having a blank oxide film deposited across the test wafer. The wafer map of FIG. 12A depicts a thickness of material (e.g., layers, films, etc.) removed from the wafer W after the prescribed etching plasma process has been completed on the test wafer.

The wafer map of FIG. 12A uses a color scale or gray scale to graphically show the uniformity characteristics of the process results across the wafer W.

In general, a set of data measurement points $z_i$ exist at locations $(x_i, y_i)$ across the area of the wafer W, where the area of the wafer W is defined by $x^2+y^2<=R^2$, with R being the radius of the wafer W. Each data measurement point $z_i$ represents a corresponding portion of the total wafer W area. In some embodiments, the coordinates $(x_i, y_i)$ of the various points $z_i$ are selected so that each point $z_i$ represents a substantially similar sized portion of the total wafer W area. However, it should be understood that the measured data values at the various points $z_i$ can be weighted by a corresponding wafer W area associated with the various points $z_i$ in computing wafer-level metrics. The wafer-level uniformity metrics shown in FIG. 12A include calculated values for the mean value of the film thickness based on measurements taken at all points $z_i$ across the wafer W, and the three standard deviation (3-sigma) value of the film thickness based on measurements taken at all points $z_i$ across the wafer W, and the range of film thickness variation across the wafer W based on measurements taken at all points $z_i$ across the wafer W. The three standard deviation (3-sigma) value of the film thickness across the wafer W is sometimes referred to as the within-wafer-nonuniformity (WIWNU) metric.

As shown in FIG. 12A, particularly high non-uniformity in plasma processing results exist in the azimuthal regions near where the TES radiofrequency signal supply pins 413 connect to the TES electrode 415 within the coupling ring 161. FIG. 12A also shows that the non-uniformity in plasma processing results across the bulk of the wafer W is significantly correlated to the peripheral azimuthal regions of high non-uniformity in plasma processing results that exist where the TES radiofrequency signal supply pins 413 connect to the TES electrode 415 within the coupling ring 161. The particularly high non-uniformity in plasma processing results on the wafer W near where the TES radiofrequency signal supply pins 413 connect to the TES electrode 415 within the coupling ring 161 is caused by the high frequency radiofrequency signals (60 MHz) that are transmitted from the electrode 109 into the plasma processing region 182 (from the first radiofrequency signal generator 147) coupling through the TES electrode 415 to the TES spider structure 1102. The single TES radiofrequency signal filter 1108 in the TES system 1100 is not capable of preventing coupling of the high frequency radiofrequency signals (60 MHz) into the TES spider structure 1102 within the TES system 1100.

In contrast with the TES system 1100, by having a separate TES radiofrequency signal filter 411A, 411B, and 411C electrically connected directly and exclusively to each TES radiofrequency signal supply pin 413A, 413B, and 413C, respectively, the TES system 1000 provides high impedance at each TES radiofrequency signal supply pin 413 to block coupling into the TES system 1000 of particular high frequency radiofrequency signals that are used to generate the plasma 180 within the plasma processing region 182, where the high frequency radiofrequency signals used to generate the plasma 180 within the plasma processing region 182 have one or more frequencies within a range extending from about 1 megaHertz to about 100 megaHertz, such as 60 megaHertz by way of example. Therefore, the high frequency radiofrequency signals that reach the TES radiofrequency signal supply pins 413A, 413B, and 413C are not able to circulate within/around the TES radiofrequency signal supply conductor 409 within the TES system 1000.

Figure 12B:
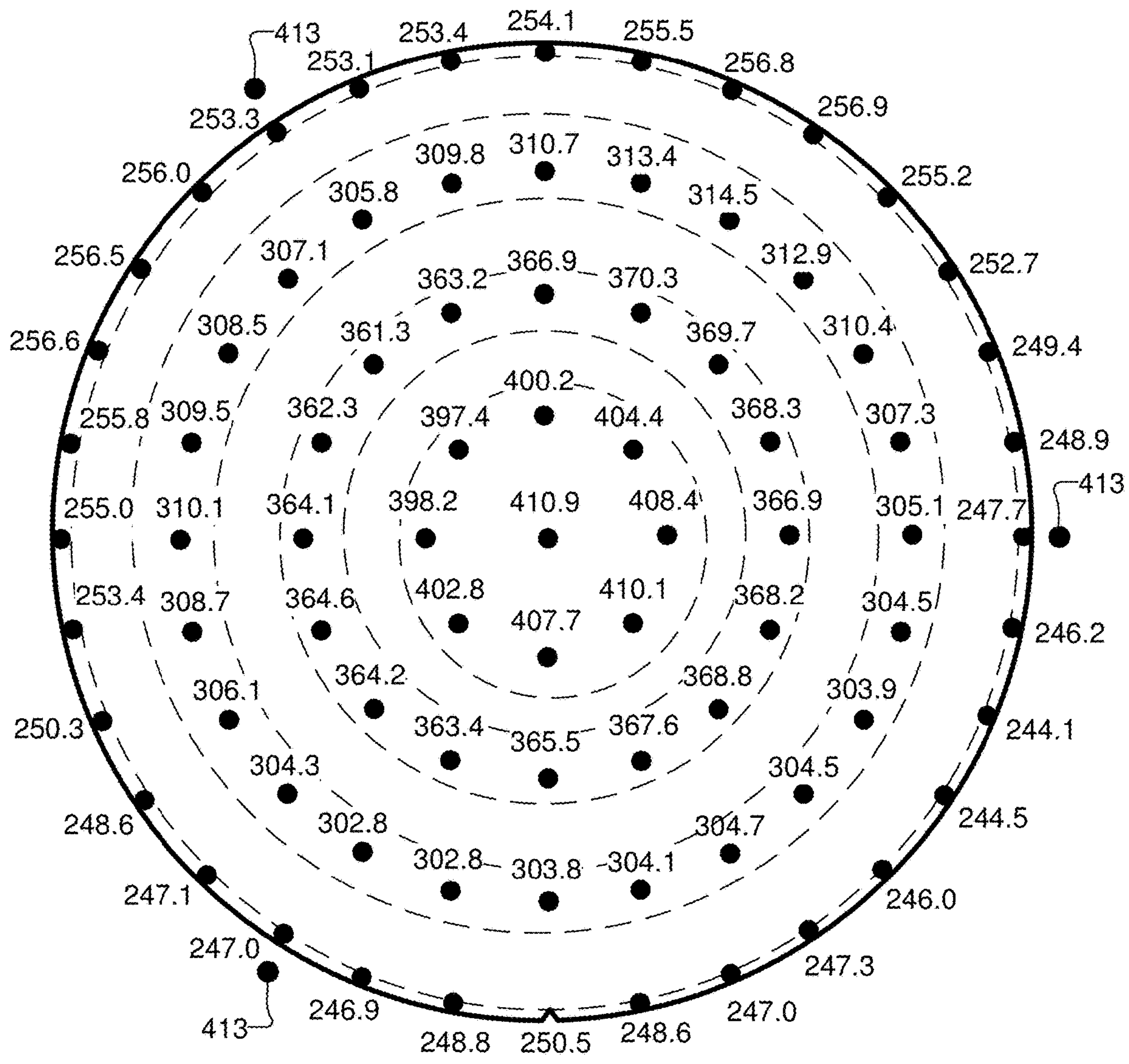
FIG. 12B shows a wafer map of plasma processing results across the wafer obtained using the TES system of FIGS. 1A, 1B, 3B, 9A, 9B, 9C, 10A, and 10B, in accordance with some embodiments.

FIG. 12B shows a wafer map of plasma processing results across the wafer W obtained using the TES system 1000 of FIGS. 1A, 1B, 3B, 9A, 9B, 9C, 10A, and 10B, in accordance with some embodiments. The plasma processing results of FIG. 12B were obtained by using the TES system 1100 to perform the same prescribed etching plasma process (as was performed to generate the results of FIG. 12A) on a test wafer having a blank oxide film deposited across the test wafer. Therefore, the plasma processing results of FIG. 12B are directly comparable with the plasma processing results of FIG. 12A, so as to enable direct comparison of the TES system 1000 with the TES system 1100. As shown in FIG. 12B, by having the separate TES radiofrequency signal filters 411A, 411B, and 411C directly and exclusively electrically connected to each of the TES radiofrequency signal supply pins 413A, 413B, and 413C, respectively, there is no noticeable azimuthal non-uniformity in plasma process results near where the TES radiofrequency signal supply pins 413A, 413B, and 413C electrically and physically connect to the TES electrode 415 within the coupling ring 161.

Figure 12C:
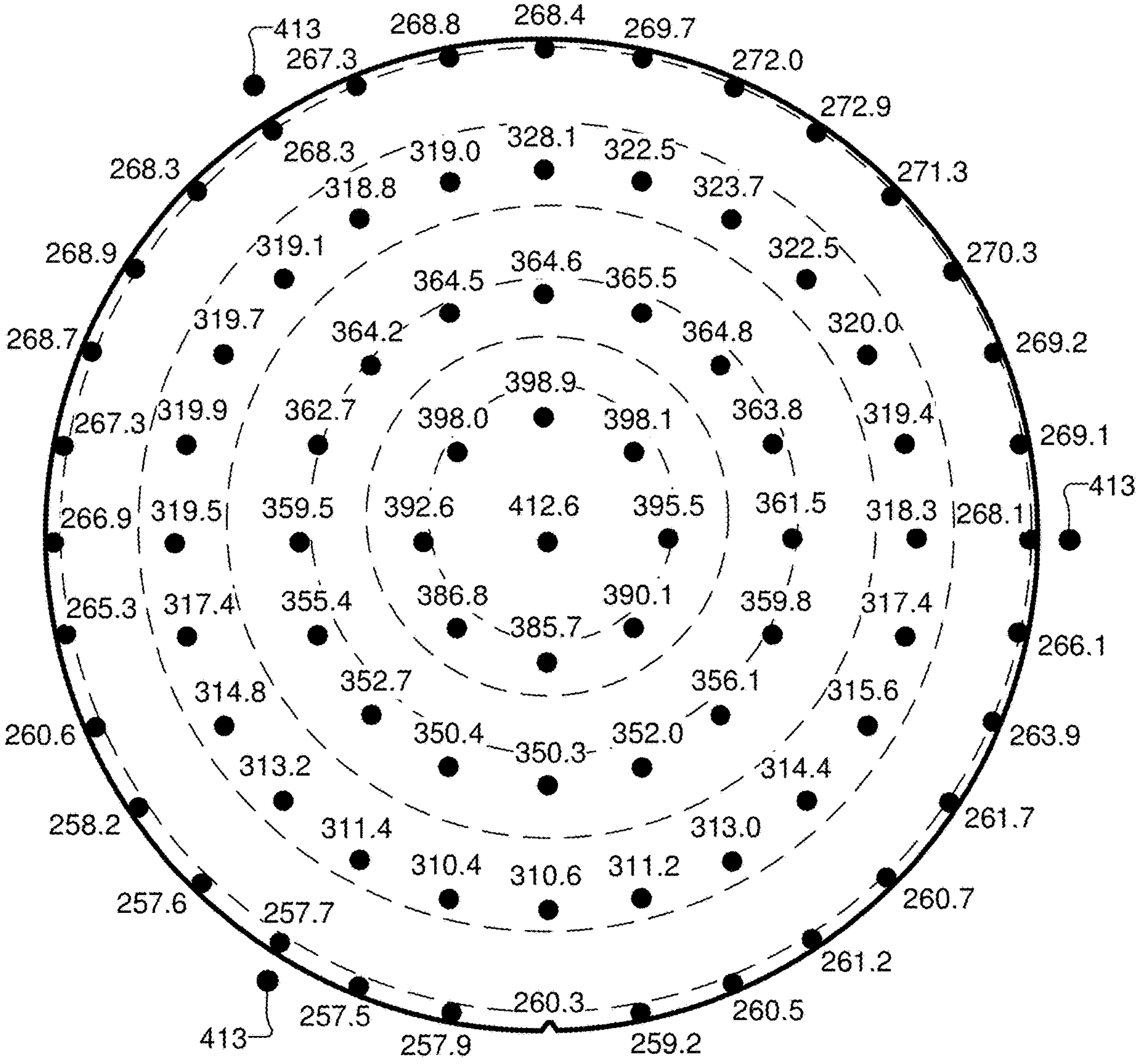
FIG. 12C shows a wafer map of plasma processing results across the wafer obtained with the TES radiofrequency signal supply pins disconnected from the corresponding TES radiofrequency signal filters, respectively, in accordance with some embodiments.

For further comparison, FIG. 12C shows a wafer map of plasma processing results across the wafer W obtained with the TES radiofrequency signal supply pins 413A, 413B, and 413C disconnected from the corresponding TES radiofrequency signal filters 411A, 411B, and 411C, respectively, in accordance with some embodiments. The plasma processing results of FIG. 12C were obtained by performing the same prescribed etching plasma process (as was performed to generate the results of FIGS. 12A and 12B) on a test wafer having a blank oxide film deposited across the test wafer. Therefore, FIG. 12C essentially represents the plasma processing results across the wafer W without connection of either the TES system 1000 or the TES system 1100. Comparison of the results shown in FIG. 12C with those shown in FIGS. 12A and 12B indicates that the uniformity of the plasma processing results across the wafer W obtained using the TES system 1000, having the separate TES radiofrequency signal filters 411A, 411B, and 411C exclusively and directly connected to the TES radiofrequency signal supply pins 413A, 413B, and 413C, respectively, is comparable to not having the TES system 1000 connected. Therefore, it is shown that having the separate TES radiofrequency signal filters 411A, 411B, and 411C directly and exclusively connected to the TES radiofrequency signal supply pins 413A, 413B, and 413C, respectively, effectively blocks coupling of the high frequency radiofrequency signals from the plasma 180 into the TES system 1000.

Figure 13A:
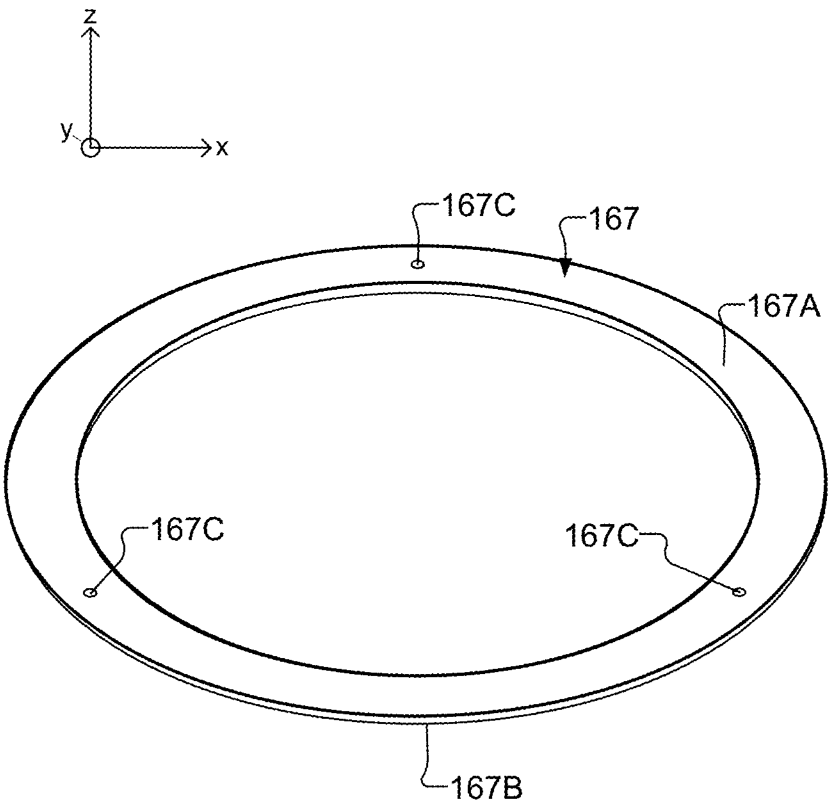
FIG. 13A shows a perspective view of the edge ring, in accordance with some embodiments.

FIG. 13A shows a perspective view of the edge ring 167, in accordance with some embodiments. The edge ring 167 has a top surface 167A and a bottom surface 167B. A number of holes 167C are formed through the bottom surface 167B to receive the fasteners 901 as discussed with regard to FIG. 9A. It should be understood that the number of holes 167C do not extend all the way to the top surface 167A of the edge ring 167. While the example of FIG. 13A shows three holes 167C, it should be understood that in other embodiments the number of holes 167C for receiving the fasteners 901 can be greater than three, such as six or nine, among others. In some embodiments, the edge ring 167 is a consumable component, meaning that the edge ring 167 can lose material through plasma-induced corrosion and effectively wear out after a certain number plasma processing operations are performed within the plasma processing system 100. Therefore, the edge ring 167 is a replaceable component within the plasma processing system 100.

Figure 13B:
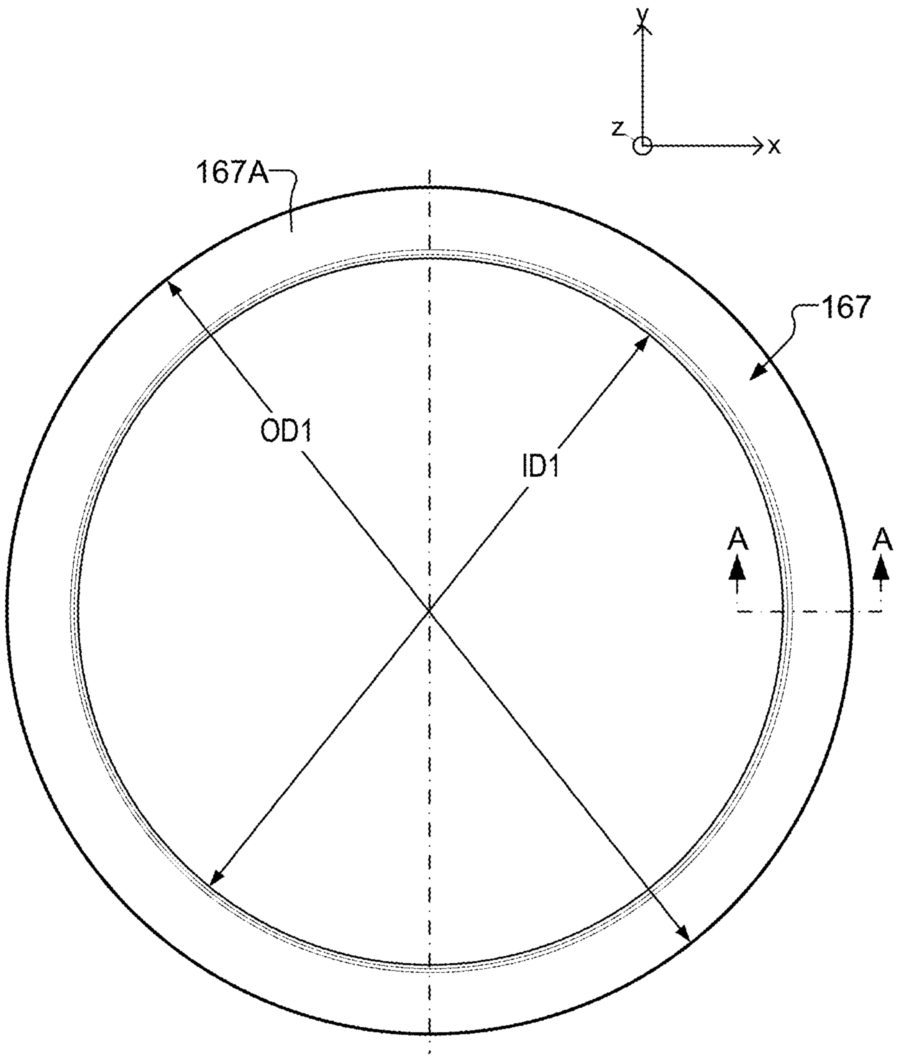
FIG. 13B shows a top view of the edge ring, in accordance with some embodiments.

FIG. 13B shows a top view of the edge ring 167, in accordance with some embodiments. The edge ring 167 has an inner diameter ID1 and an outer diameter OD1. The inner diameter ID1 corresponds to a diameter of an inner peripheral edge of the edge ring 167, and the outer diameter OD1 is a diameter of an outer peripheral edge of the edge ring 167. In various embodiments, a size of the inner diameter ID1 is determined by the diameter of the ceramic layer 110, such that the inner peripheral edge of the edge ring 167 will be proximate to an outer peripheral edge of the ceramic layer 110.

Figure 13C:
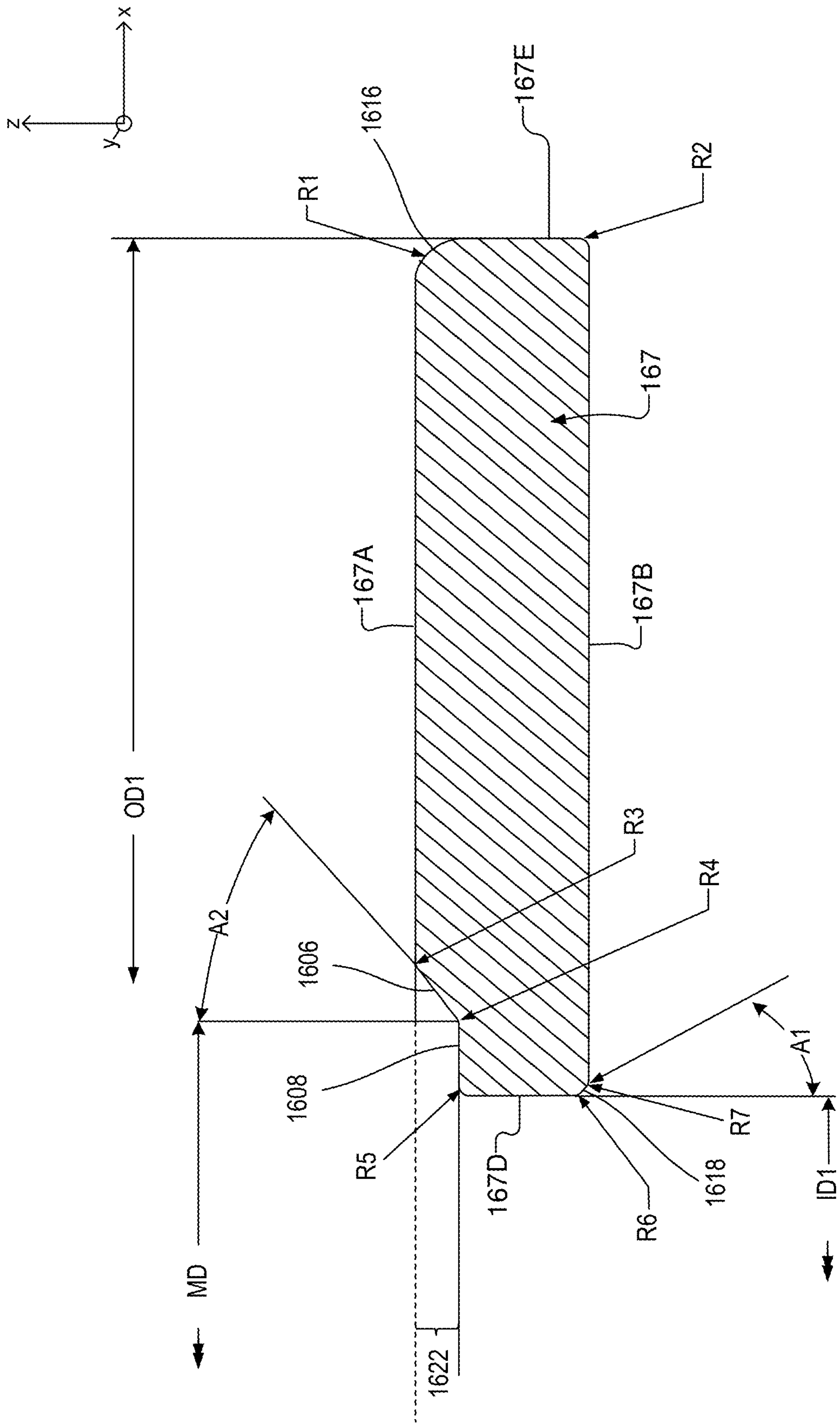
FIG. 13C shows a vertical cross-sectional view of the edge ring, referenced as View A-A in FIG. 13B, in accordance with some embodiments.

FIG. 13C shows a vertical cross-sectional view of the edge ring 167, referenced as View A-A in FIG. 13B, in accordance with some embodiments. The edge ring 167 has an inner surface 167D present at the inner peripheral edge of the edge ring 167. The edge ring 167 also has an outer surface 167E present at the outer peripheral edge of the edge ring 167. In some embodiments, each of the top surface 167A and the bottom surface 167B of the edge ring 167 has a horizontal orientation (oriented substantially parallel with the x-y plane), and each of the inner surface 167D and the outer surface 167E has a vertical orientation (oriented substantially parallel with the z-direction), when the edge ring 167 is disposed within the plasma processing system 100. Also, it should be understood that the edge ring 167 has an annular shape, which can also be referred to as a ring-shape or dish-shape, among others.

The edge ring 228 has a step 1622 that includes an angled inner surface 1606 and a horizontally oriented inner surface 1608. The angled inner surface 1606 forms an angle A2, with respect to the vertically oriented inner surface 167D. The angled inner surface 1608 is contiguous with the top surface 167A. In some embodiments, an edge between the angled inner surface 1606 and the top surface 167A is formed to have a radius R3. The horizontally oriented inner surface 1608 is contiguous with the angled inner surface 1606. In some embodiments, an edge between the horizontally oriented inner surface 1608 and the angled inner surface 1606 is formed to have a radius R4. The edge between the horizontally oriented inner surface 1608 and the angled inner surface 1606 is located in accordance with a middle diameter (MD) that is concentric with the inner diameter ID1 and outer diameter OD1. The inner surface 167D is contiguous with the horizontally oriented inner surface 1608. In some embodiments, an edge between the inner surface 167D and the horizontally oriented inner surface 1608 is formed to have a radius R5.

The inner surface 167D is contiguous with an angled inner surface 1618. In some embodiments, an edge between the inner surface 167D and the angled inner surface 1618 is formed to have a radius R6. The angled inner surface 1618 is continuous with the bottom surface 167B. In some embodiments, an edge between the angled inner surface 1618 and the bottom surface 167B is formed to have a radius R7. In some embodiments, the radius R7 has a value that is about twice the value of radius R6.

The outer surface 167E is contiguous with the bottom surface 167B. In some embodiments, an edge between the outer surface 167E and the bottom surface 167B is formed to have a radius R2. The outer surface 167E is contiguous with the top surface 167A. In some embodiments, an edge between the outer surface 167E and the top surface 167A is formed to have a radius R1. The curvature of the edge ring 167 provided by the radius R1 reduces a probability of RF power arcing between the edge ring 167 and the cover ring 165.

Figure 14:
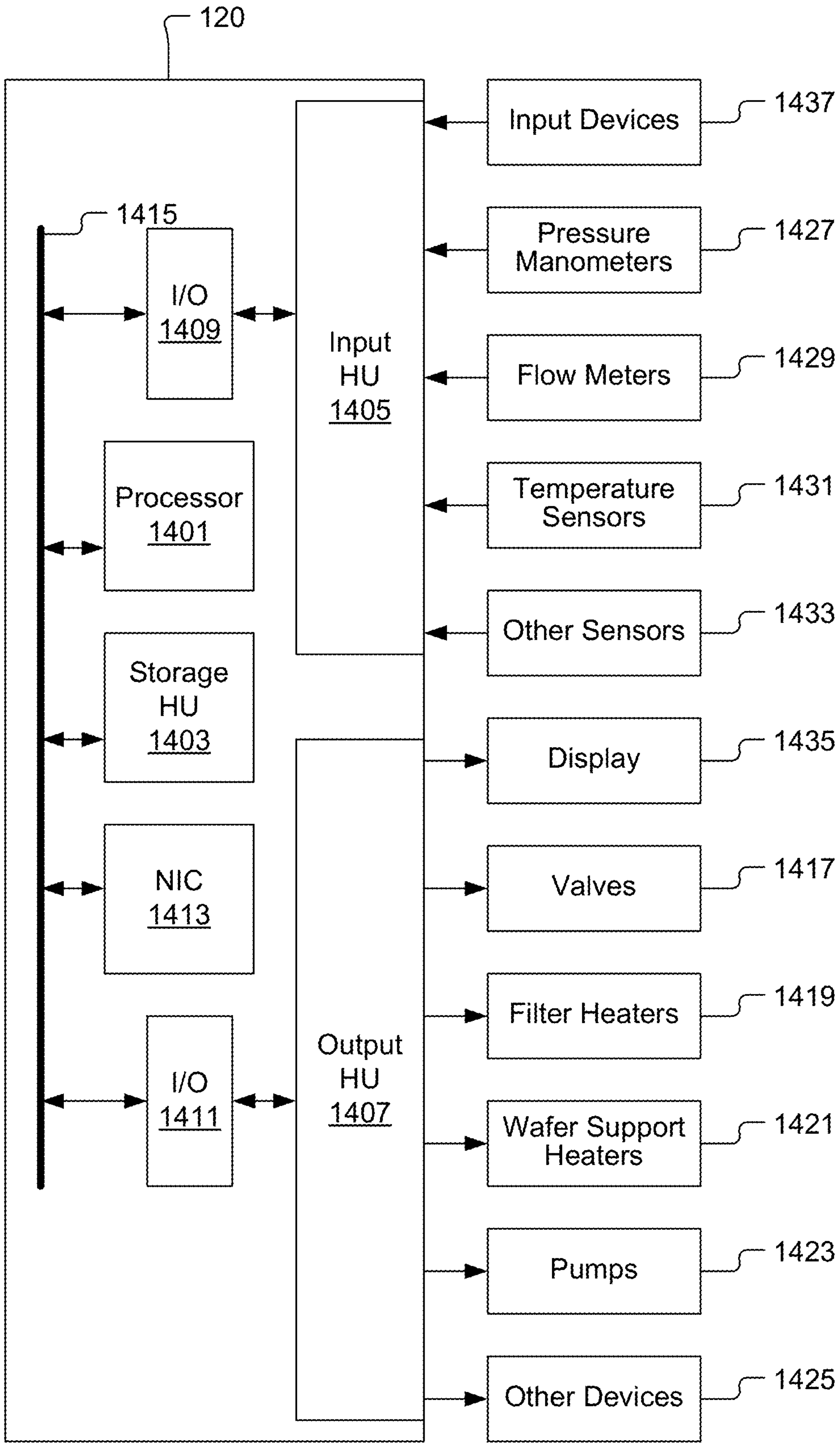
FIG. 14 shows an example schematic of the control system of FIG. 1A, in accordance with some embodiments.

FIG. 14 shows an example schematic of the control system 120 of FIG. 1A, in accordance with some embodiments. In some embodiments, the control system 120 is configured as a process controller for controlling the semiconductor fabrication process performed in plasma processing system 100. In various embodiments, the control system 120 includes a processor 1401, a storage hardware unit (HU) 1403 (e.g., memory), an input HU 1405, an output HU 1407, an input/output (I/O) interface 1409, an I/O interface 1411, a network interface controller (NIC) 1413, and a data communication bus 1415. The processor 1401, the storage HU 1403, the input HU 1405, the output HU 1407, the I/O interface 1409, the I/O interface 1411, and the NIC 1413 are in data communication with each other by way of the data communication bus 1415. The input HU 1405 is configured to receive data communication from a number of external devices. Examples of the input HU 1405 include a data acquisition system, a data acquisition card, etc. The output HU 1407 is configured to transmit data to a number of external devices. An examples of the output HU 1407 is a device controller. Examples of the NIC 1413 include a network interface card, a network adapter, etc. Each of the I/O interfaces 1409 and 1411 is defined to provide compatibility between different hardware units coupled to the I/O interface. For example, the I/O interface 1409 can be defined to convert a signal received from the input HU 1405 into a form, amplitude, and/or speed compatible with the data communication bus 1415. Also, the I/O interface 1407 can be defined to convert a signal received from the data communication bus 1415 into a form, amplitude, and/or speed compatible with the output HU 1407. Although various operations are described herein as being performed by the processor 1401 of the control system 120, it should be understood that in some embodiments various operations can be performed by multiple processors of the control system 120 and/or by multiple processors of multiple computing systems in data communication with the control system 120.

In some embodiments, the control system 120 is employed to control devices in various wafer fabrication systems based in-part on sensed values. For example, the control system 120 may control one or more of valves 1417, filter heaters 1419, wafer support structure heaters 1421, pumps 1423, and other devices 1425 based on the sensed values and other control parameters. The valves 1417 can include valves associated with control of the backside gas supply system 129, the process gas supply system 191, and the temperature control fluid circulation system 125. The control system 120 receives the sensed values from, for example, pressure manometers 1427, flow meters 1429, temperature sensors 1431, and/or other sensors 1433, e.g., voltage sensors, current sensors, etc. The control system 120 may also be employed to control process conditions within the plasma processing system 100 during performance of plasma processing operations on the wafer W. For example, the control system 120 can control the type and amounts of process gas(es) supplied from the process gas supply system 191 to the plasma processing region 182. Also, the control system 120 can control operation of the first radiofrequency signal generator 147, the second radiofrequency signal generator 149, the impedance matching system 143, the TES radiofrequency signal generator 403, and the TES impedance matching system 401. Also, the control system 120 can control operation of the DC supply 117 for the clamping electrode(s) 112. The control system 120 can also control operation of the lifting devices 133 for the lift pins 132 and operation of the door 107. The control system 120 also controls operation of the backside gas supply system 129 and the temperature control fluid circulation system 125. The control system 120 also control vertical movement of the cantilever arm assembly 115. The control system 120 also controls operation of the throttle member 196 and the pump that controls suction at the exhaust port 105. The control system 120 also controls operation of the hold-down control mechanisms 913 of the hold-down rods 911 of the TES system 1000. The control system 120 also receives input from the temperature probe of the TES system 1000. It should be understood that the control system 120 is equipped to provide for programmed and/or manual control any function within the plasma processing system 100.

In some embodiments, the control system 120 is configured to execute computer programs including sets of instructions for controlling process timing, process gas delivery system temperature, and pressure differentials, valve positions, mixture of process gases, process gas flow rate, backside cooling gas flow rate, chamber pressure, chamber temperature, wafer support structure temperature (wafer temperature), RF power levels, RF frequencies, RF pulsing, impedance matching system 143 settings, cantilever arm assembly position, bias power, and other parameters of a particular process. Other computer programs stored on memory devices associated with the control system 120 may be employed in some embodiments. In some embodiments, there is a user interface associated with the control system 120. The user interface include a display 1435 (e.g., a display screen and/or graphical software displays of the apparatus and/or process conditions), and user input devices 1437 such as pointing devices, keyboards, touch screens, microphones, etc.

Software for directing operation of the control system 120 may be designed or configured in many different ways. Computer programs for directing operation of the control system 120 to execute various wafer fabrication processes in a process sequence can be written in any conventional computer readable programming language: for example, assembly language, C, C++, Pascal, Fortran or others. Compiled object code or script is executed by the processor 1401 to perform the tasks identified in the program. The control system 120 can be programmed to control various process control parameters related to process conditions such as, for example, filter pressure differentials, process gas composition and flow rates, backside cooling gas composition and flow rates, temperature, pressure, plasma conditions, such as RF power levels and RF frequencies, bias voltage, cooling gas/fluid pressure, and chamber wall temperature, among others. Examples of sensors that may be monitored during the wafer fabrication process include, but are not limited to, mass flow control modules, pressure sensors, such as the pressure manometers 1427 and the temperature sensors 1431. Appropriately programmed feedback and control algorithms may be used with data from these sensors to control/adjust one or more process control parameters to maintain desired process conditions.

In some implementations, the control system 120 is part of a broader fabrication control system. Such fabrication control systems can include semiconductor processing equipment, including a processing tools, chambers, and/or platforms for wafer processing, and/or specific processing components, such as a wafer pedestal, a gas flow system, etc. These fabrication control systems may be integrated with electronics for controlling their operation before, during, and after processing of the wafer. The control system 120 may control various components or subparts of the fabrication control system. The control system 120, depending on the wafer processing requirements, may be programmed to control any of the processes disclosed herein, including the delivery of processing gases, the delivery of backside cooling gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the control system 120 may be defined as electronics having various integrated circuits, logic, memory, and/or software that receive instructions, issue instructions, control operation, enable wafer processing operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the control system 120 in the form of various individual settings (or program files), defining operational parameters for carrying out a particular process on the wafer W within system 100. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The control system 120, in some implementations, may be a part of or coupled to a computer that is integrated with, coupled to the plasma processing system 100, or otherwise networked to the system 100, or a combination thereof. For example, the control system 120 may be in the "cloud" of all or a part of a fab host computer system, which can allow for remote access of the wafer processing. The computer may enable remote access to the system 100 to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to the system 100 over a network, which may include a local network or the Internet.

The remote computer may include a user interface that enables entry or programming of parameters and/or settings, which are then communicated to the system 100 from the remote computer. In some examples, the control system 120 receives instructions in the form of data, which specify parameters for each of the processing steps to be performed during one or more operations. It should be understood that the parameters may be specific to the type of process to be performed within the plasma processing system 100. Thus as described above, the control system 120 may be distributed, such as by comprising one or more discrete controllers that are networked together and working towards a common purpose, such as the processes and controls described herein. An example of a distributed controller for such purposes would be one or more integrated circuits on the plasma processing system 100 in communication with one or more integrated circuits located remotely (such as at the platform level or as part of a remote computer) that combine to control a process performed on the plasma processing system 100.

Without limitation, example systems that the control system 120 can interface with may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers. As noted above, depending on the process step or steps to be performed by the tool, the control system 120 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Embodiments described herein may also be implemented in conjunction with various computer system configurations including hand-held hardware units, microprocessor systems, microprocessor-based or programmable consumer electronics, minicomputers, mainframe computers and the like. Embodiments described herein can also be implemented in conjunction with distributed computing environments where tasks are performed by remote processing hardware units that are linked through a network. It should be understood that the embodiments described herein, particularly those associated with the control system 120, can employ various computer-implemented operations involving data stored in computer systems. These operations are those requiring physical manipulation of physical quantities. Any of the operations described herein that form part of the embodiments are useful machine operations. The embodiments also relate to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network, the data may be processed by other computers on the network, e.g., a cloud of computing resources.

Various embodiments described herein can be implemented through process control instructions instantiated as computer-readable code on a non-transitory computer-readable medium. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes, and other optical and non-optical data storage hardware units. The non-transitory computer-readable medium can include computer-readable tangible medium distributed over a network-coupled computer system so that the computer-readable code is stored and executed in a distributed fashion.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

What is claimed is:

1. A tunable edge sheath system, comprising:

a coupling ring configured to couple to a bottom surface of an edge ring that surrounds a wafer support area within a plasma processing chamber;

an electrode embedded within the coupling ring, the electrode having an annular shape;

a plurality of radiofrequency signal supply pins coupled to the electrode embedded within the coupling ring, each of the plurality of radiofrequency signal supply pins extending through a corresponding hole formed through a bottom surface of the coupling ring;

a plurality of radiofrequency signal filters respectively connected to the plurality of radiofrequency signal supply pins, each of the plurality of radiofrequency signal filters configured to provide a high impedance to a radiofrequency signal used to generate a plasma within the plasma processing chamber; and a ring-shaped radiofrequency signal supply conductor, wherein each of the plurality of radiofrequency signal filters is electrically connected between a respective one of the plurality of radiofrequency signal supply pins and the ring-shaped radiofrequency signal supply conductor.

2. The tunable edge sheath system as recited in claim 1, wherein the radiofrequency signal used to generate the plasma within the plasma processing chamber has a frequency within a range extending from about 1 megaHertz to about 100 megaHertz.

3. The tunable edge sheath system as recited in claim 1, wherein each of the plurality of radiofrequency signal supply pins is exclusively connected to a corresponding one of the plurality of radiofrequency signal filters.

4. The tunable edge sheath system as recited in claim 1, further comprising:

a radiofrequency signal generator electrically connected through an impedance matching system to supply radiofrequency signals through the plurality of radiofrequency signal filters and through the plurality of radiofrequency signal supply pins to the electrode embedded within the coupling ring.

5. The tunable edge sheath system as recited in claim 1, further comprising:

a radiofrequency signal supply conductor, each of the plurality of radiofrequency signal filters electrically connected to the radiofrequency signal supply conductor.

6. The tunable edge sheath system as recited in claim 5, wherein connection locations of the plurality of radiofrequency signal filters to the radiofrequency signal supply conductor are substantially equally spaced apart around the radiofrequency signal supply conductor.

7. The tunable edge sheath system as recited in claim 5, wherein the plurality of radiofrequency signal filters and the radiofrequency signal supply conductor are disposed within an atmospheric environment isolated from the plasma within the plasma processing chamber.

8. The tunable edge sheath system as recited in claim 5, further comprising:

a radiofrequency signal supply line electrically connected between a radiofrequency signal output of an impedance matching system and the radiofrequency signal supply conductor.

9. The tunable edge sheath system as recited in claim 8, further comprising:

a capacitor having a first terminal electrically connected to both the radiofrequency signal supply conductor and the radiofrequency signal supply line, the capacitor having a second terminal electrically connected to a reference ground potential.

10. The tunable edge sheath system as recited in claim 1, wherein connection locations of the plurality of radiofrequency signal supply pins to the electrode within the coupling ring are substantially equally spaced apart around the electrode within the coupling ring.

11. The tunable edge sheath system as recited in claim 1, wherein a number of the plurality of radiofrequency signal supply pins is three, and wherein a number of the plurality of radiofrequency signal filters is three.

12. A plasma processing system, comprising:

a primary electrode having a substantially cylindrical shape defined by a top surface, a bottom surface, and an outer side surface;

a ceramic layer disposed on the top surface of the primary electrode, the ceramic layer configured to receive and support a semiconductor wafer;

a radiofrequency signal generator electrically connected through an impedance matching system to the primary electrode, the radiofrequency signal generator configured to generate and supply radiofrequency signals to the primary electrode;

an edge ring formed of an electrically conductive material and configured to circumscribe the ceramic layer, the edge ring positioned radially adjacent to the ceramic layer;

a coupling ring coupled to a bottom surface of the edge ring, the coupling ring formed of an electrical insulator material, the coupling ring including an embedded electrode;

a plurality of radiofrequency signal supply pins electrically and physically connected to the embedded electrode, each of the plurality of radiofrequency signal supply pins extending through a corresponding hole formed through a bottom surface of the coupling ring; and a plurality of radiofrequency signal filters respectively connected to the plurality of radiofrequency signal supply pins, each of the plurality of radiofrequency signal filters configured to provide a high impedance to the radiofrequency signals that are supplied to the primary electrode by the radiofrequency signal generator; and a ring-shaped radiofrequency signal supply conductor, wherein each of the plurality of radiofrequency signal filters is electrically connected between a respective one of the plurality of radiofrequency signal supply pins and the ring-shaped radiofrequency signal supply conductor.

13. The plasma processing system as recited in claim 12, wherein each of the plurality of radiofrequency signal supply pins is exclusively connected to a corresponding one of the plurality of radiofrequency signal filters.

14. The plasma processing system as recited in claim 12, wherein said radiofrequency signal generator is a first radiofrequency signal generator, and wherein said impedance matching system is a first impedance matching system, the plasma processing system including a second radiofrequency signal generator electrically connected through a second impedance matching system to supply radiofrequency signals through the plurality of radiofrequency signal filters and through the plurality of radiofrequency signal supply pins to the embedded electrode.

15. The plasma processing system as recited in claim 14, further comprising:

a radiofrequency signal supply conductor, each of the plurality of radiofrequency signal filters electrically connected to the radiofrequency signal supply conductor.

16. The plasma processing system as recited in claim 15, wherein connection locations of the plurality of radiofrequency signal filters to the radiofrequency signal supply conductor are substantially equally spaced apart around the radiofrequency signal supply conductor.

17. The plasma processing system as recited in claim 15, wherein the plurality of radiofrequency signal filters and the radiofrequency signal supply conductor are disposed within an atmospheric environment isolated from a plasma processing region overlying the ceramic layer.

18. The plasma processing system as recited in claim 15, further comprising:

a radiofrequency signal supply line electrically connected between a radiofrequency signal output of the second impedance matching system and the radiofrequency signal supply conductor.

19. The plasma processing system as recited in claim 18, further comprising:

a capacitor having a first terminal electrically connected to both the radiofrequency signal supply conductor and the radiofrequency signal supply line, the capacitor having a second terminal electrically connected to a reference ground potential.

20. The plasma processing system as recited in claim 12, wherein the embedded electrode has a substantially annular shape, wherein connection locations of the plurality of radiofrequency signal supply pins to the embedded electrode are substantially equally spaced apart around the embedded electrode.

* * * * *